(12) United States Patent
Zhu et al.

(10) Patent No.: US 12,120,944 B2
(45) Date of Patent: Oct. 15, 2024

(54) MATERIALS AND METHOD FOR TRAPPING LEAD LEAKAGE IN PEROVSKITE SOLAR CELLS

(71) Applicant: City University of Hong Kong, Kowloon (HK)

(72) Inventors: Zonglong Zhu, Kowloon (HK); Alex Kwan-Yue Jen, Kowloon (HK); Zhen Li, Kowloon (HK)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 18/076,612

(22) Filed: Dec. 7, 2022

(65) Prior Publication Data
US 2024/0215432 A1   Jun. 27, 2024

(51) Int. Cl.
*H10K 85/10*   (2023.01)
*H01G 9/00*    (2006.01)
(Continued)

(52) U.S. Cl.
CPC ......... *H10K 85/151* (2023.02); *H01G 9/0036* (2013.01); *H01G 9/2009* (2013.01);
(Continued)

(58) Field of Classification Search
CPC .... H01G 9/0036; H01G 9/2009; H10K 30/40; H10K 30/65; H10K 30/82; H10K 30/88;
(Continued)

(56) References Cited

U.S. PATENT DOCUMENTS

2021/0143351 A1*  5/2021  Huang ............... H10K 30/81
2023/0247845 A1*  8/2023  Huang ............... H10K 30/821
                                                       136/263

FOREIGN PATENT DOCUMENTS

WO   WO-2019100070 A1 *  5/2019

OTHER PUBLICATIONS

Kin Wu, et al., Designs from single junctions, heterojunctions to multijunctions for high-performance perovskite solar cells, Chem. Soc. Rev., 2021, 50, 13090.
(Continued)

*Primary Examiner* — Kourtney R S Carlson
(74) *Attorney, Agent, or Firm* — Renner, Kenner, Greive, Bobak, Taylor & Weber

(57) ABSTRACT

A lead trapping layer includes an acidic cation-exchange resin comprising a formula selected from the group consisting of Formulae (I) to (V) below, in which each M$^+$ is independently selected from the group consisting of Sr$^{2+}$, Ca$^{2+}$, Ni$^{2+}$, Cu$^{2+}$, Co$^{2+}$, Zn$^{2+}$, Mg$^{2+}$, Ba$^{2+}$, K$^+$, NH$^{4+}$, Na$^+$, H$^+$, and Li$^+$; and each R is independently selected from the group consisting of SO$_3$H, CH$_2$SO$_3$H, PO$_3$H$_2$, and COOH; and an encapsulation resin selected from the group consisting of epoxy resin, silicone resin, arcrylate resin, and a combination thereof. A solar cell device includes at least one lead trapping layer and a method may prepare the lead trapping layer.

(Continued)

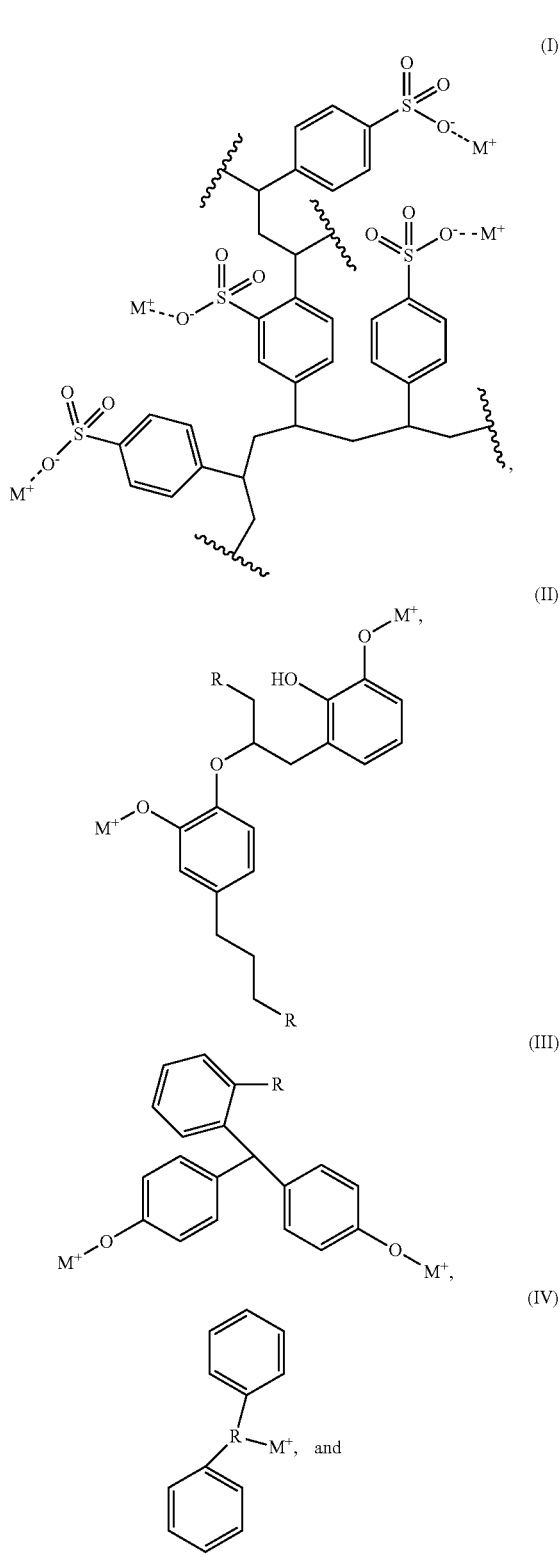

20 Claims, 13 Drawing Sheets

(51) Int. Cl.
  H01G 9/20 (2006.01)
  H10K 30/40 (2023.01)
  H10K 30/65 (2023.01)
  H10K 30/82 (2023.01)
  H10K 85/20 (2023.01)
  H10K 85/30 (2023.01)
  H10K 30/88 (2023.01)
(52) U.S. Cl.
  CPC .......... H10K 30/40 (2023.02); H10K 30/65 (2023.02); H10K 30/82 (2023.02); H10K 85/111 (2023.02); H10K 85/1135 (2023.02); H10K 85/215 (2023.02); H10K 85/30 (2023.02); H10K 30/88 (2023.02)
(58) Field of Classification Search
  CPC .......... H10K 85/111; H10K 85/1135; H10K 85/215; H10K 85/30
  See application file for complete search history.

(56) References Cited

OTHER PUBLICATIONS

Asharsh Rajagopal, et al., Toward Perovskite Solar Cell Commercialization: A Perspective and Research Roadmap Based on Interfacial Engineering, Adv. Mater., 2018, 30, 1800455.
Jin Young Kim, et al., High-efficiency perovskite solar cells, Chem. Rev. 2020, 120, 7867-7918.
Yusheng Lei, et al., A fabrication process for flexible single-crystal perovskite devices, Nature vol. 583 (Jul. 30, 2020).
Xinyu Yu, et al., Dopant-free dicyanofluoranthene-based hole transporting material with low cost enables efficient flexible perovskite solar cells, Nano Energy 82 (2021) 105701.
Zhen Li, et al., Hybrid perovskite-organic flexible tandem solar cell enabling highly efficient electrocatalysis overall water splitting, Adv. Energy Mater. 2020, 10, 2000361.
Shengfan Wu, et al., Low-Bandgap Organic Bulk-Heterojunction Enabled Efficient and Flexible Perovskite Solar Cells, Adv. Mater. 2021, 33, 2105539.
Jing Wang, et al., Interface Engineering for All-Inorganic CsPbIBr2 Perovskite Solar Cells with Enhanced Power Conversion Efficiency over 11%, Energy Technol. 2021, 9, 2100562.
Jing Wang, et al., Dopant-free hole-transporting material with enhanced intermolecular interaction for efficient and stable n-i-p perovskite solar cells, Adv. Energy Mater. 2021, 11, 2100967.

(56) References Cited

OTHER PUBLICATIONS

Best Research-Cell Efficiencies, NREL (Rev. Jan. 12, 2023).
Shengfan Wu, et al., Efficient large guanidinium mixed perovskite solar cells with enhanced photovoltage and low energy losses, Chem. Commun., 2019, 55, 4315.
Shengfan Wu, et al., Modulation of Defects and Interfaces through Alkylammonium Interlayer for Efficient Inverted Perovskite Solar Cells, Joule 4, 1248-1262.
Fengzhu Li, et al., Regulating Surface Termination for Efficient Inverted Perovskite Solar Cells with Greater Than 23% Efficiency, J. Am. Chem. Soc. 2020, 142, 20134-20142.
Xianglang Sun, et al., Efficient Inverted Perovskite Solar Cells with Low Voltage Loss Achieved by a Pyridine-Based Dopant-Free Polymer Semiconductor, Angew. Chem. Int. Ed. 2021, 60, 7227-7233.
Zhen Li, et al., Improving Photovoltaic Performance Using Perovskite/Surface-Modified Graphitic Carbon Nitride Heterojunction, Sol. RRL 2020, 4, 1900413.
Haizhou Lu, et al., Vapor-assisted deposition of highly efficient, stable black-phase FAPbI3 perovskite solar cells, Science 370, 74 (Oct. 2, 2020).
Sai Bai, et al., Planar perovskite solar cells with long-term stability using ionic liquid additives, Nature vol. 571 (Jul. 11, 2019).
Shaohang Wu, et al., A chemically inert bismuth interlayer enhances long-term stability of inverted perovskite solar cells, Nature Communications (2019)10.1161.
Lei Shi, et al., Gas chromatography-mass spectrometry analyses of encapsulated stable perovskite solar cells, Science 368, 1328 (Jun. 19, 2020).
Shuang Yang, et al., Stabilizing halide perovskite surfaces for solar cell operation with wide-bandgap lead oxysalts, Science 365, 473-478 (Aug. 2, 2019).
Bohyung Kim, et al., Molecular aspects of organic cations affecting humidity stability of perovskites, Energy Environ. Sci. 2020, 13, 805.
Xiang Deng, et al., Highly efficient and stable perovskite solar cells enabled by a fluoro-functionalized TiO2 inorganic Interlayer, Matter 4, 33041-3312 (Oct. 6, 2021).
Xin Wu, et al., Improved stability and efficiency of perovskite/organic tandem solar cells with an all-inorganic perovskite layer, J. Mater. Chem. A, 2021, 9, 19778.
Yehao Deng, et al., Reduced Self-Doping of Perovskites Induced by Short Annealing for Efficient Solar Modules, Joule 4, 1949-1960 (Sep. 16, 2020).
Jun Peng, et al., Nanoscale localized contacts for high fill factors in polymer-passivated perovskite solar cells, Science 371, 390-395 (Jan. 22, 2021).
Aobo Ren, et al., Efficient Perovskite Solar Modules with Minimized Nonradiative Recombination and Local Carrier Transport Losses, Joule 4, 1263-1277 (Jun. 17, 2020).
Linxiang Zeng, et al., Controlling the crystallization dynamics of photovoltaic perovskite layers on larger-area coatings, Energy Environ. Sci. 2020, 13, 4666.
Zhen Li, et al., Scalable fabrication of perovskite solar cells, Nature Reviews, vol. 3, No. 18017 (Mar. 27, 2018).
Xiangchuan Meng, et al., Bio-inspired vertebral design for scalable and flexible perovskite solar cells, Nature Communications (2020)11. 3016.
Xiaotian Hu, et al., Nacre-inspired crystallization and elastic "brick-and-mortar" structure for a wearable perovskite solar module, Energy Environ. Sci., 2019, 12, 979.

Weijun Ke, et al., Prospects for low-toxicity lead-free perovskite solar cells, Nature Communications, (2019)10.965.
Riming Nie, et al., Lead-free perovskite solar cells enabled by hetero-valent substitutes, Energy Environ. Sci., 2020, 13, 2363.
Min Chen, et al., High-Performance Lead-Free Solar Cells Based on Tin-Halide Perovskite Thin Films Functionalized by a Divalent Organic Cation, ACS Energy Lett. 2020, 5, 2223-2230.
Yan Jiang, et al., Reduction of lead leakage from damaged lead halide perovskite solar modules using self-healing polymer-based encapsulation, Nature Energy, vol. 4, Jul. 2019, 585-593.
Xun Li, et al., On-device lead sequestration for perovskite solar cells, Nature, vol. 578, p. 555 (Feb. 27, 2020).
Shangshang Chen, et al., Trapping lead in perovskite solar modules with abundant and low-cost cation-exchange resins, Nature Energy, vol. 5, Dec. 2020, 1003-1011.
Shengfan Wu, et al., 2D metal-organic framework for stable perovskite solar cells with minimized lead leakage, Nature Nanotechnology, vol. 15, Nov. 2020, 934-940.
Nicole Moody, et al., Assessing the Regulatory Requirements of Lead-Based Perovskite Photovoltaics, Joule 4, 967-974 (May 20, 2020).
Parikhit Sinha, et al., Regulatory policy governing cadmium-telluride photovoltaics: A case study contrasting life cycle management with the precautionary principle, Energy Policy 36 (2008) 381-387.
Emilio J. Juarez-Perez, et al., Thermal degradation of CH3NH3PbI3 perovskite into NH3 and CH3I gases observed by coupled thermogravimetry-mass spectrometry analysis, Energy Environ. Sci. 2016, 9, 3406.
Ming-Gang Ju, et al., Toward Eco-friendly and Stable Perovskite Materials for Photovoltaics, Joule 2, 1231-1241 (Jul. 18, 2018).
Antonio Abate, Perovskite Solar Cells Go Lead Free, Joule 1, 659-664 (Dec. 20, 2017).
Zejiao Shi, et al., Lead-Free Organic-Inorganic Hybrid Perovskites for Photovoltaic Applications: Recent Advances and Perspectives, Adv. Mater. 2017, 29, 1605005.
Afaf Lalmi, et al., Removal of lead from polluted waters using ion exchange resin with Ca(NO3)2 for elution, Hydrometallurgy 178 (2018) 287-293.
Purolite C100 Product Data Sheet (Mar. 1, 2023).
A. Dabrowski, et al., Selective removal of the heavy metal ions from waters and industrial wastewaters by ion-exchange method, Chemosphere 56 (2004) 91-106.
Nopphorn Chanthapon, et al., Lead removal by a reusable gel cation exchange resin containing nano-scale zero valent iron, Chem. Eng. J. 331 (2018) 545-555.
FM Approved Photovoltaic Modules.
G. Mathiak, et al., PV Module Damages Caused by Hail Impact Field Experience and Lab Tests, 31st European Photovoltaic Solar Energy Conference and exhibition.
Ramez Abdallah, et al., The Effects of Soiling and Frequency of Optimal Cleaning of PV Panels in Palestine, Energies 2022, 15, 4232.
Climalogical Information Serv., Hong Kong Observatory.
Shuang Yang, et al., Fractionalization of perovskite thin films with moisture-tolerant molecules, Nature Energy, vol. 1, Feb. 2016.
Jisong Hu, et al., First-Principles Calculations of Graphene-Coated CH3NH3PbI3 toward Stable Perovskite Solar Cells in Humid Environments, ACS Appl. Nano Mater. 2020, 3, 7704-7712.
Directive 2011/65/EU of the European Parliament and of the Council of Jun. 8, 2011 on the restriction of the use of certain hazardous substances in electrical and electronic equipment, Official Journal of the European Union.

\* cited by examiner

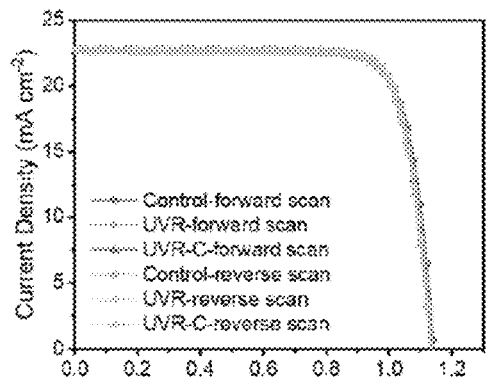
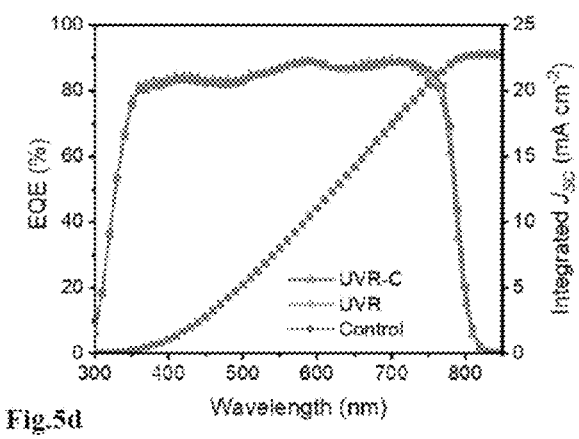
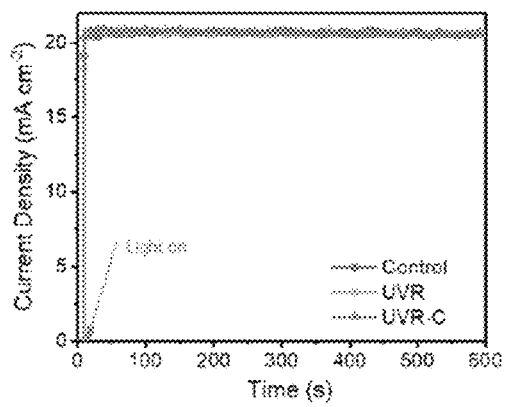
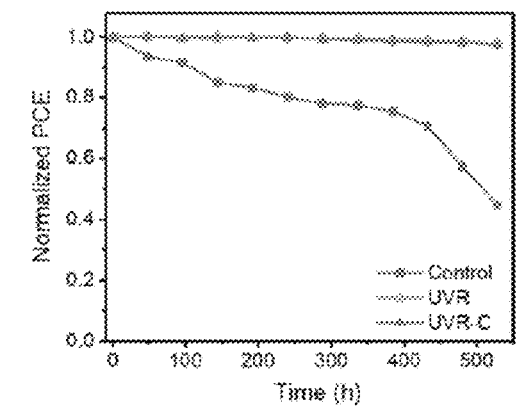
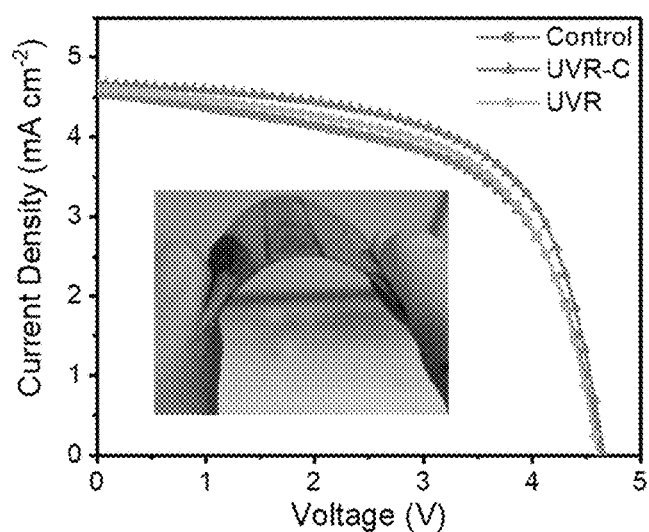

Fig. 18
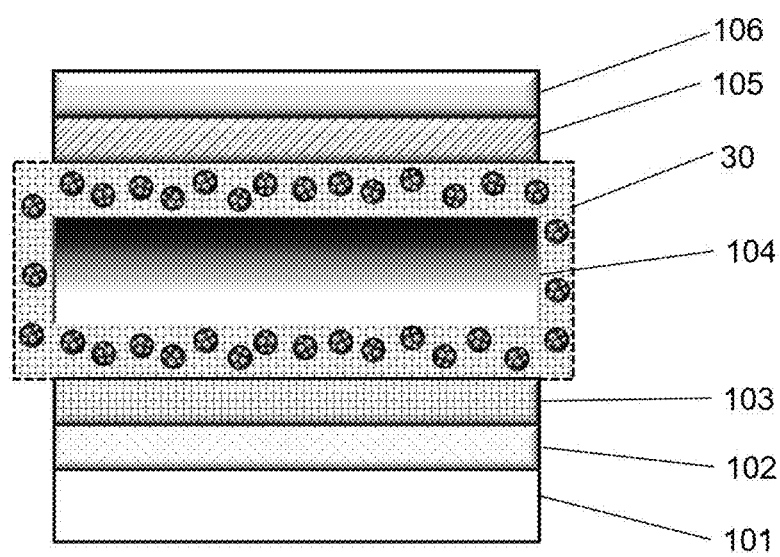
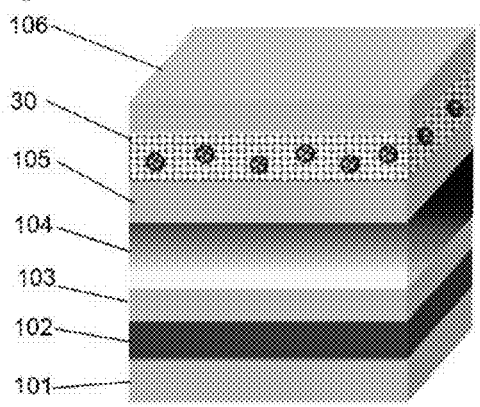
Fig. 19a
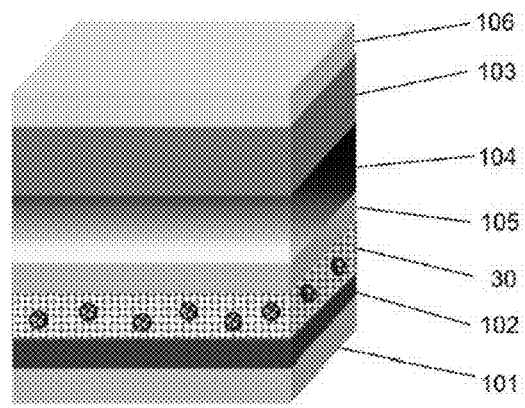
Fig. 19b

MATERIALS AND METHOD FOR TRAPPING LEAD LEAKAGE IN PEROVSKITE SOLAR CELLS

FIELD OF THE INVENTION

The invention generally relates to perovskite solar cells, particularly to materials and method for trapping lead leakage in perovskite solar cells.

BACKGROUND

Organic-inorganic hybrid lead halide perovskites have attracted tremendous attention as light harvesters in photovoltaics owing to their outstanding photoelectric properties combined with good solution processability and compatibility with flexible substrates. Recently, the best single-junction perovskite solar cells (PVSCs) reached a certified power conversion efficiency (PCE) of 25.5%, which can rival most thin-film photovoltaics, including silicon solar cells, Copper Indium Gallium Selenide Solar Cells (CIGS), CdTe, etc. Moreover, the operational stability of PVSCs has been significantly improved through successful engineering of perovskite compositions, surface defects, and interfaces during the past few years, which shows long-term stability under continuous one sun illumination for over 1000 h with negligible PCE loss. Meanwhile, significant efforts have been devoted to scale up PVSCs, leading to the high-performance large area devices and modules, which provide a promising roadmap for their commercialization. However, as elemental lead (Pb) is one of the critical components for perovskite absorbers in PVSCs, potential lead leakage due to damage caused by external factors (impacts, wind, temperature changes, fire) is a significant obstacle for them to enter the market. Therefore, it is urgent to address the Pb toxicity issue and develop eco-friendly PVSCs to promote commercialization.

In order to deal with lead leakage, the most common way is to reduce the amount of lead used in perovskite, leading to decreased lead content in order to minimize lead pollution. However, the currently reported lead-free PVSCs showed much lower PCE of ~12% and stability, which severely hampers their practical applications. As such, when PVSCs containing lead are used in order to seek for higher PCE, developing new strategies for preventing lead leakage of the PVSCs is needed.

SUMMARY OF THE INVENTION

An embodiment of the present invention relates to a lead trapping layer including:
(a) an acidic cation-exchange resin comprising a formula selected from the group of:

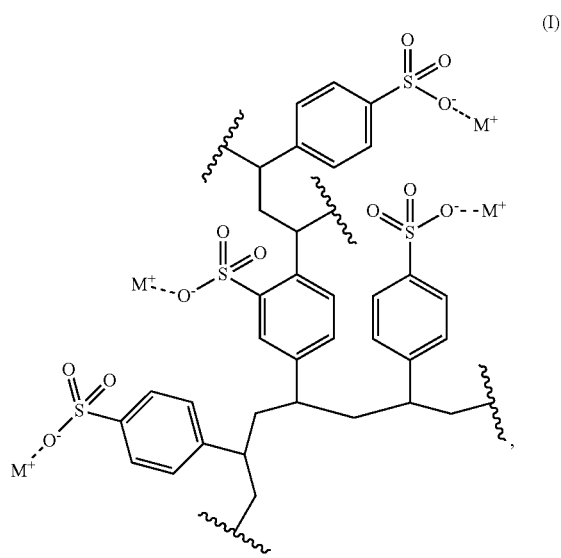

(I)

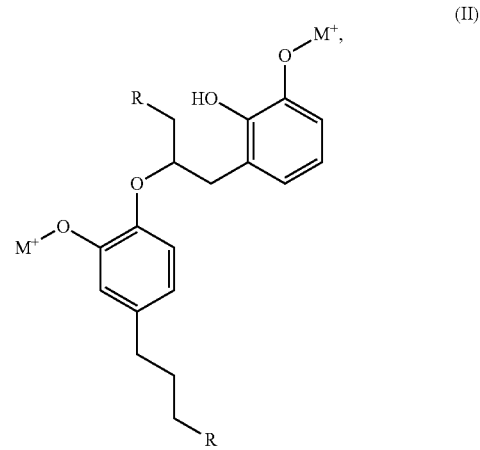

(II)

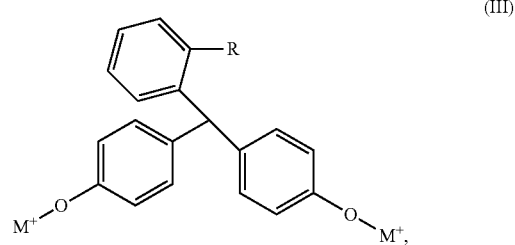

(III)

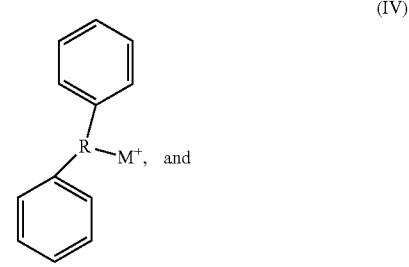

(IV)

and

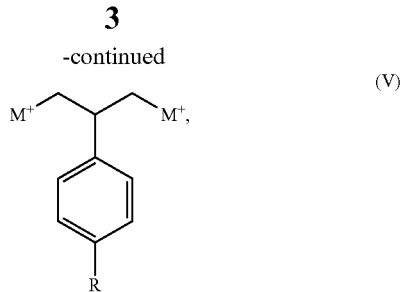

in which each $M^+$ is independently selected from the group of $Sr^{2+}$, $Ca^{2+}$, $Ni^{2+}$, $Cu^{2+}$, $Co^{2+}$, $Zn^{2+}$, $Mg^{2+}$, $Ba^{2+}$, $K^+$, $NH_4^+$, $Na^+$, $H^+$, and $Li^+$; and each R is independently selected from the group of $SO_3H$, $CH_2SO_3H$, $PO_3H_2$, and COOH; and (b) an encapsulation resin selected from the group of an epoxy resin, a silicone resin, an arcrylate resin, and a combination thereof.

An embodiment of the present invention relates to a solar cell device including at least one lead trapping layer according to the invention.

An embodiment of the present invention relates to a method of preparing the lead trapping layer according to the invention, including the steps of:

mixing the acidic cation-exchange resin and the encapsulation resin under vigorous mechanical stirring to form a colloidal mixed resin; and applying the colloidal mixed resin to a position selected from the group of:
(1) only on the upper surface of the metal electrode;
(2) from the top of the device extended downwards to wrap the side of the device;
(3) on the periphery of the device;
(4) on the top and bottom of the device;
(5) between the perovskite functional layer and the first hole-transport layer;
(6) on the upper and lower surfaces of the perovskite functional layer;
(7) around the perovskite functional layer; and
(8) between the first electron-transport layer and the metal electrode.

Without intending to be limited by theory it is believed that the lead trapping layer can effectively trap $Pb^{2+}$, preventing them from leaching out from a perovskite solar cell to the environment, so that the perovskite solar cell can be widely-used.

BRIEF DESCRIPTION OF THE DRAWINGS

FIG. 5a shows an embodiment of the J-V curves in forward and reverse scans for control device and devices with UVR and UVR-C, respectively;

FIG. 5b shows an embodiment of the external quantum efficiency (EQE) spectra for control device and devices with UVR and UVR-C, respectively;

FIG. 5c shows an embodiment of the stabilized-power-output (SPO) spectra at maximum power point (MPP) for control device and devices with UVR and UVR-C, respectively;

FIG. 5d shows an embodiment of testing the long-term stability of the control device and devices with UVR and UVR-C in ambient air for over 500 h;

FIG. 6 shows an embodiment of J-V curves of the flexible control PVSM and PVSMs with UVR and UVR-C encapsulation: the inset is the photograph of the flexible PVSM with an area of 25 $cm^2$;

FIG. 18 shows an embodiment of lead-absorbing encapsulation structure of n-i-p perovskite solar cells, in which the conductive lead trapping layer 30 is coated around the perovskite functional layer 104;

FIG. 19a shows an embodiment of lead-absorbing encapsulation structure of perovskite solar cells, in which the conductive lead trapping layer 30 is coated between the electron-transport layer 105 and the metal electrode 106 of p-i-n perovskite solar cells;

FIG. 19b shows an embodiment of lead-absorbing encapsulation structure of perovskite solar cells, in which the conductive lead trapping layer 30 is coated between the the electron-transport layer 105 and the transparent conductive layer 102 of n-i-p perovskite solar cells;

Figure 1A:
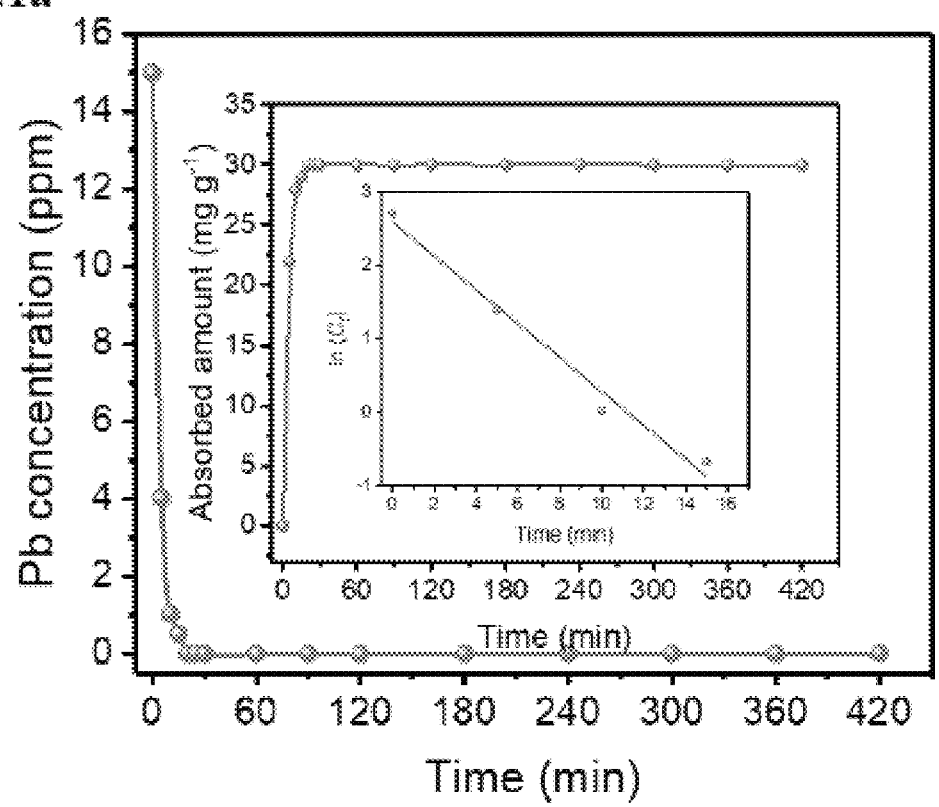
FIG. 1a shows $Pb^{2+}$ sorption kinetics of the cation exchange resin at an initial $Pb^{2+}$ concentration of 15.0 ppm according to Example 1, in which the two inserted figures are the corresponding adsorbed $Pb^{2+}$ amount and the Lagergren first-order kinetic plot of the $Pb^{2+}$ sorption, respectively.
Figure 1B:
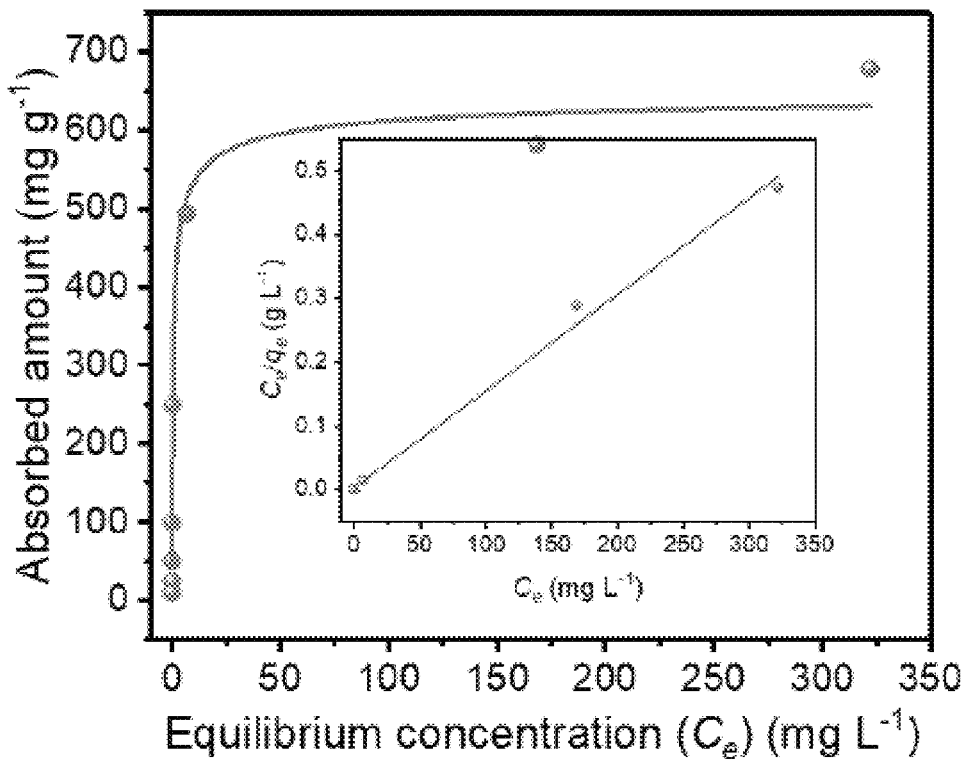
FIG. 1b shows $Pb^{2+}$ Langmuir sorption isotherm of the cation exchange resin according to Example 1, in which the inset is the linear fit with the Langmuir adsorption model.

The figures herein are for illustrative purposes only and are not necessarily drawn to scale.

DESCRIPTION OF THE PREFERRED EMBODIMENTS

Unless otherwise specifically provided, all tests herein are conducted at standard conditions which include a room and testing temperature of 25° C., sea level (1 atm.) pressure, pH 7, and all measurements are made in metric units. Furthermore, all percentages, ratios, etc. herein are by weight, unless specifically indicated otherwise. It is understood that unless otherwise specifically noted, the materials compounds, chemicals, etc. described herein are typically commodity items and/or industry-standard items available from a variety of suppliers worldwide.

An embodiment of the present invention relates to a lead trapping layer including:

(a) an acidic cation-exchange resin having a structure selected from the group of:

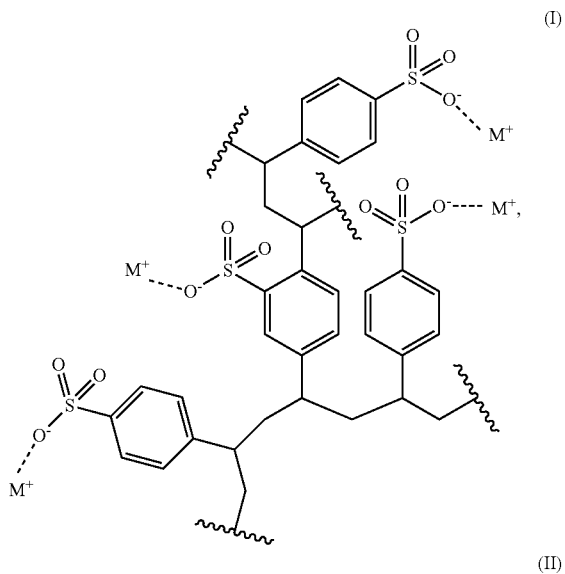

(I)

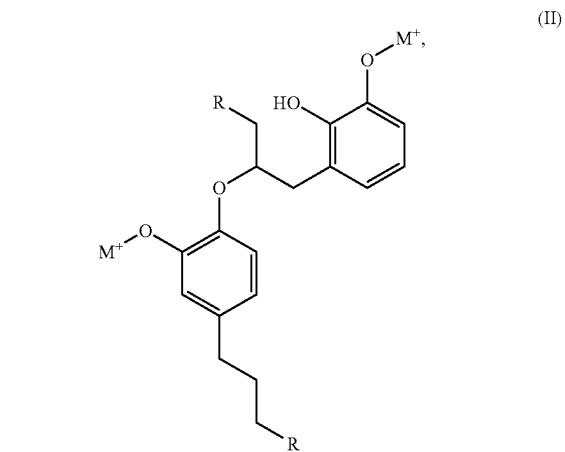

(II)

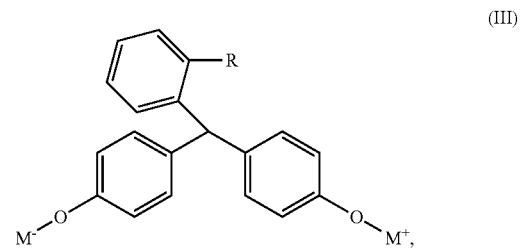

(III)

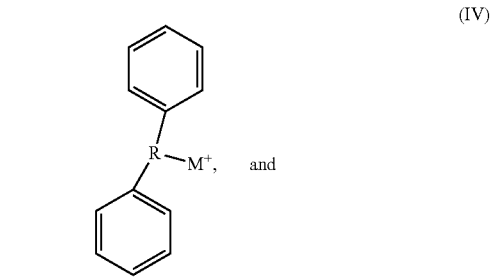

(IV)

and

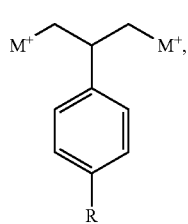

(V)

where
- each $M^+$ is independently selected from the group of $Sr^{2+}$, $Ca^{2+}$, $Ni^{2+}$, $Cu^{2+}$, $Co^{2+}$, $Zn^{2+}$, $Mg^{2+}$, $Ba^{2+}$, $K^+$, $NH_4^+$, $Na^+$, $H^+$, and $Li^+$; and
- each R is independently selected from the group of $SO_3H$, $CH_2SO_3H$, $PO_3H_2$, and COOH; and (b) an encapsulation resin selected from the group of an epoxy resin, a silicone resin, an arcrylate resin, and a combination thereof.

In some embodiments, the lead trapping layer contains only the acidic cation-exchange resin and encapsulation resin as described above.

Without intending to be limited by theory, it is believed that the lead trapping layer can effectively trap $Pb^{2+}$, preventing them from leaching out from a perovskite solar cell to the environment, so that the cell will be applicable, for example, in the field, buildings, electronic products and wearable devices.

In some embodiments, the acidic cation-exchange resin may have a structure selected from the group of formula (I) and formula (II); or of formula (I). In some embodiments, the acidic cation-exchange resin has a structure including at least two sulfonic groups.

In certain embodiments, the acidic cation-exchange resin includes a R group selected from the group of $SO_3H$, $CH_2SO_3H$, $PO_3H_2$, and a combination thereof; the group of $SO_3H$, $CH_2SO_3H$, and a combination thereof; or of $SO_3H$. Without intending to bel limited by theory, it is believed that these strong acid groups such as sulfonic group and phosphate group in the acidic cation-exchange resin can convert $Pb^{2+}$ to the corresponding salts by the cation exchange reaction.

In some embodiment, the acidic cation-exchange resin includes a $M^+$ selected from the group of $Ca^{2+}$, $Mg^{2+}$, $K^+$, $Na^+$, and $H^+$; or from the group of $Na^+$ and $H^+$, since these two cation can be applied in all PH environment.

In certain embodiments, the acidic cation-exchange resin has a structure of formula selected from the group of formulae (I-1) to (V-1) as below; or from the group of formula (I-1), formula (I-2) and formula (II-1); or from the group of formula (I-1) and formula (I-2):

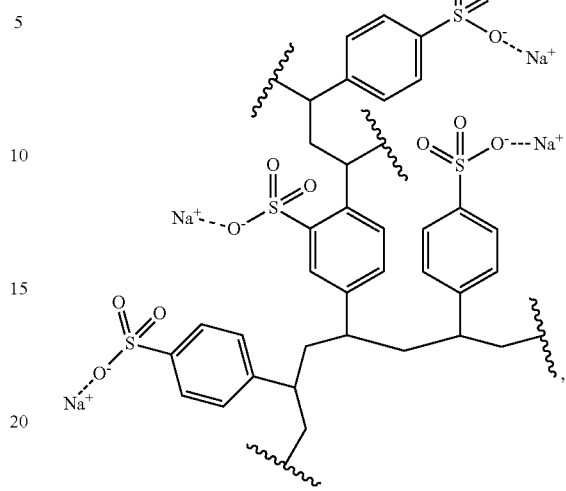

(I-1)

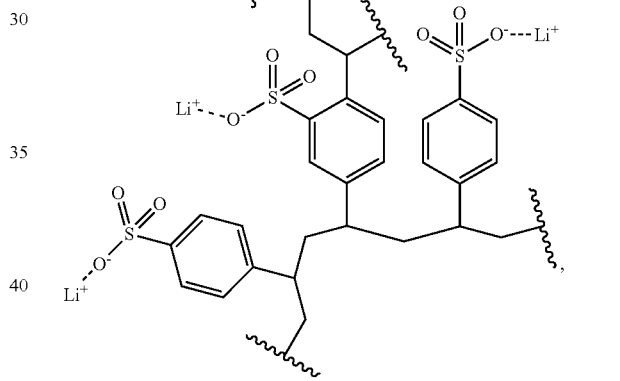

(I-2)

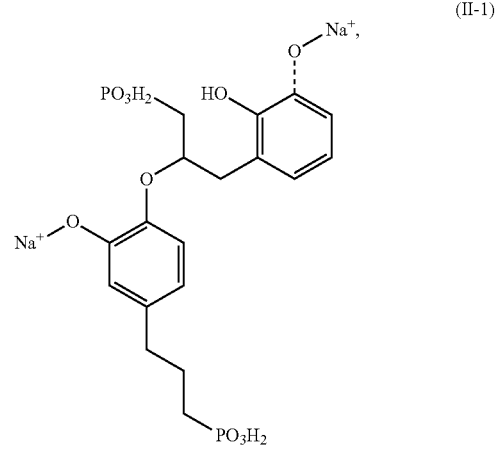

(II-1)

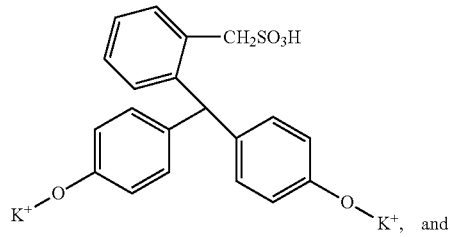

(III-1)

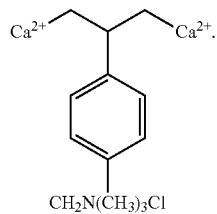

Taking the resin having a structure of formula I-1 for example, it is believed that in an embodiment herein, the order of the highly acidic cation exchange resins in adsorbing ion is list below: $Pb^{2+}>Ca^{2+}>Mg^{2+}>K^+>Na^+>H^+$, which indicates, for example, that the affinity of $SO_3^-$ to $Pb^{2+}$ exceeds that of $Na^+$, so the resin can release $Na^+$ to adsorb $Pb^{2+}$. The reaction can be written as: $2(X—SO_3Na)+Pb^{2+}=(X—SO_3)_2Pb+2Na^+$, where the X represents the organic portion of the resin and $SO_3^-$ is the immobile portion of the ion active group, two $SO_3^-$ sites are required to react with $Pb^{2+}$.

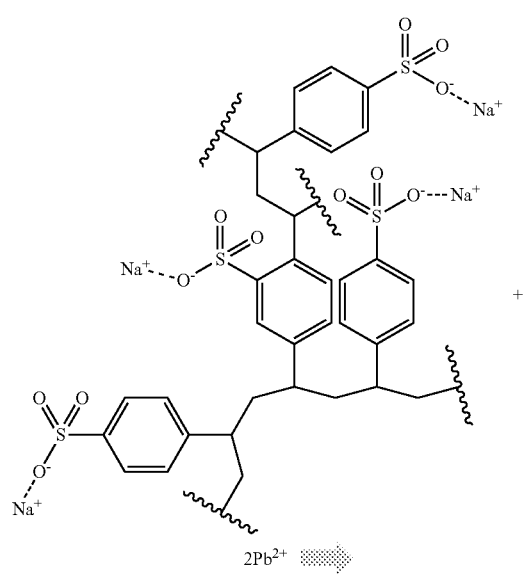

(V-1)

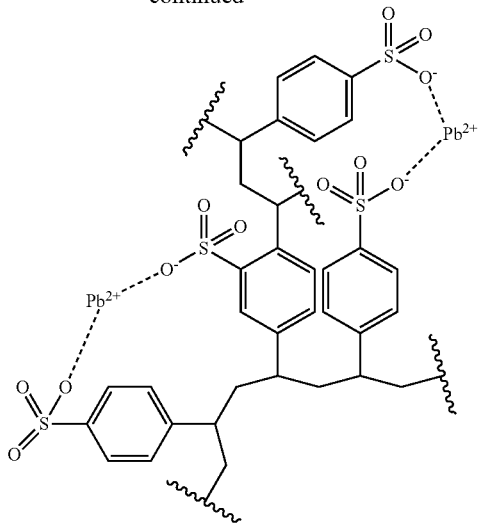

The high density of negative charge of $SO_3^-$ could attract the $Pb^{2+}$ in the aqueous solution, due to the Donnan membrane effect, and then form a precipitate to remove the lead.

In certain embodiments, the encapsulation resin and the acidic cation-exchange resin are present in a weight ratio ranging from about 20:1 to about 200:1 in the lead trapping layer according to the invention. For example, the weight ratio of the encapsulation resin to the acidic cation-exchange resin may be about 25:1, about 30:1, about 40:1, about 50:1, about 60:1, about 70:1, about 80:1, about 90:1, about 100:1, or about 150:1. It is believed that these ratios ensure the mixed encapsulant possesses both encapsulation and $Pb^{2+}$ trapping functions. The over dose of encapsulation resin or the acidic cation resin will break this balance.

In some embodiments, the encapsulation resin is selected from the group of epoxy resin, and acrylate resin; or of epoxy resin, such as ultraviolet-cured resin (UVR). It is believed that epoxy resin, after being mixed with the acidic cation-exchange resin (e.g., formula I-1), is more stable than the other types of encapsulation resin.

In certain embodiments, the lead trapping layer according to the invention further contains lead. This means that when the lead leakage from perovskite degraded devices, the lead trapping layer can capture $Pb^{2+}$ then convert it to lead-containing sediment, which will not contaminate the water. The amount of lead depends on the lead content of the perovskite devices and the maximum lead adsorption capability of the acidic cation resin in the lead trapping layer.

An embodiment of the present invention relates to a solar device including at least one lead trapping layer according to the invention. For example, the solar device may include one, two or three layers of the lead trapping layer. "Solar device" used herein encompasses both single junction solar cells and multi-junction solar cells (i.e., modules) unless specified otherwise.

In certain embodiments, the at least one lead trapping layer comprises a trapping lead group having a substitute-lead positive ion and an acid group. In some embodiments, each substitute-lead positive ion is independently selected from the group of $Sr^{2+}$, $Ca^{2+}$, $Ni^{2+}$, $Cu^{2+}$ $Co^{2+}$, $Zn^{2+}$, $Mg^{2+}$, $Ba^{2+}$, $K^+$, $NH_4^+$, $Na^+$, $H^+$, and $L^+$, or from the group of $Ca^{2+}$, $Mg^{2+}$, $K^+$, $Na^+$, and $H^+$; or from the group of $Na^+$ and $H^+$, since these two cation can be applied in all PH environment. The affinity of the acid groups (such as $SO_3^-$) to $Pb^{2+}$ exceeds that of these substitute-lead positive ions so that the resin can release these positive ions to adsorb $Pb^{2+}$. In short, the substitute-lead positive ion in the at least one lead trapping layer may be substituted with lead in use. In some embodiments, the substitute-lead positive ion is $Na^+$ or $H^+$. The strong acid resins containing $Na^+$ or $H^+$ are highly dissociated and the exchangeable $Na^+$ and $H^+$ can readily exchange over the entire PH ranges.

In some embodiments, the acid group in the at least one lead trapping layer is the R group as defined for Formulae (I) to (V) above. In some embodiments, each R is independently selected from the group of $SO_3H$, $CH_2SO_3H$, $PO_3H_2$, and COOH. In some embodiments, each R is a sulfonic acid group independently-selected from the group of $SO_3H$ and $CH_2SO_3H$.

Figure 3A:
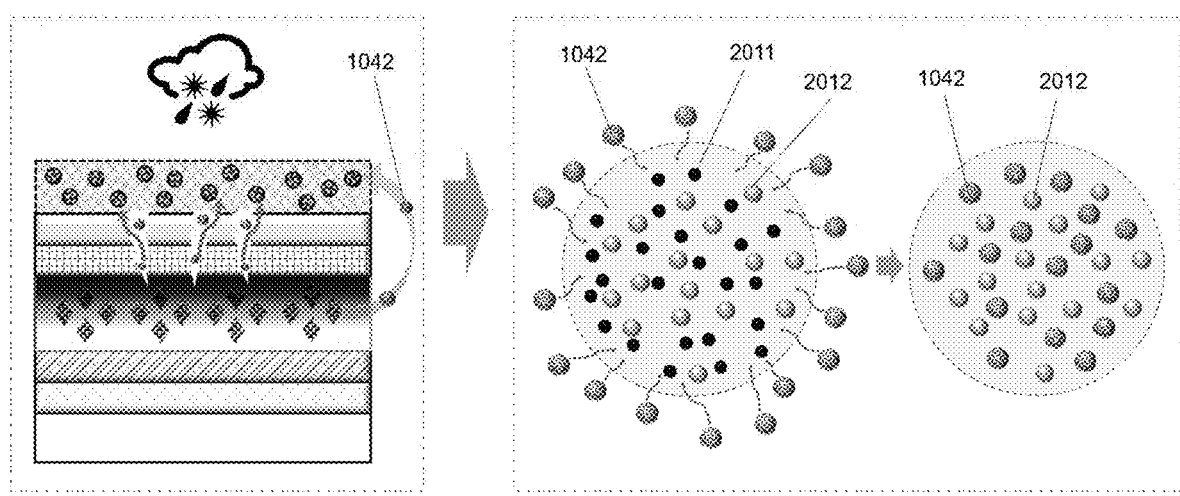
FIG. 3a shows a schematic diagram of the lead trapping mechanism of the cation exchange resin.

FIG. 3a shows an embodiment of the lead trapping mechanism of the lead trapping layer according to the invention. When a perovskite solar module (PVSM) is damaged due to external factors such as rain or hail, the rainwater could readily penetrate into the perovskite layer through the cracks to extract $Pb^{2+}$ (1042) from the degraded perovskite to potentially contaminate the environment/ground. However, the acidic cation-exchange resin of the present invention located in the device can effectively trap $Pb^{2+}$, potentially preventing it from leaching out to the environment. FIG. 3a shows cations (2011) and acid ions (2012) in acid cation exchange resins.

In certain embodiments, a solar device according to the invention includes a periphery comprising a top, a bottom opposite the top, and a side between the top and the bottom, and further includes the following layers from the bottom to the top:

(1) a substrate layer having an upper surface and a lower surface;
(2) a transparent conductive layer having an upper surface and a lower surface;
(3) a first hole-transport layer having an upper surface and a lower surface;
(4) a first photovoltaic functional layer having an upper surface and a lower surface, in which the first photovoltaic functional layer is a perovskite functional layer;
(5) a first electron-transport layer having an upper surface and a lower surface;
(6) a metal electrode having an upper surface and a lower surface; and
(7) the at least one lead trapping layer comprising an upper surface and a lower surface; in which the positions of the first hole-transport layer and the first electron-transport layer are exchangeable.

In some embodiments, the solar device according to the invention further includes:

(8) a second hole-transport layer comprising an upper surface and a lower surface;
(9) a second photovoltaic functional layer comprising an upper surface and a lower surface; and
(10) a second electron-transport layer comprising an upper surface and a lower surface; in which the positions of the second hole-transport layer and the second electron-transport layer are exchangeable.

In some embodiments, the layers from (9) to (11) are inserted between the transparent conductive layer and the first hole-transport layer/the first electron-transport layer, or alternatively, between the metal electrode and the first electron-transport layer/the first hole-transport layer.

In some embodiments, the device further includes:

(11) an anti-reflection layer coated on the lower surface of the substrate.

Without intending to be limited by theory, it is believed that such a structure provides a guarantee of the safe-to-use perovskite device without scarifying the device's efficiency.

In certain embodiments, the substrate in the solar device according to the invention is a flexible or rigid material with light transmittance greater than about 80% (at 550 nm). In some embodiments, the substrate may be selected from the group of glass, polymethyl methacrylate (PMMA), polycarbonate (PC), purpose polystyrene (PS), polyethylene glycol terephthalate (PET), polyethylene naphthalate (PEN), polydimethylsiloxane (PDMS), styrene-ethylene-butylene-styrene (SEBS), (ethylene terephthalateco-1,4-cylclohex-ylenedimethylene terephthalate (PETG), acrylonitrile butadiene styrene copolymers (ABS), polypropylene (PP), polyamide (PA), acrylonitrile-styrene copolymer (AS), and a combination thereof; or from the group of glass, PET, PEN, PDMS, SEBS, PP and a combination thereof; or from the group of glass, PET, PEN, PDMS and a combination thereof. The present invention can utilize a variety of substrates widely used in photovoltaic industry.

The present invention can utilize a variety of transparent conductive layer materials widely used in photovoltaic industry. In certain embodiments, the transparent conductive layer in the solar device according to the invention has a material selected from the group of Indium Tin Oxide (ITO), Aluminum Zinc Oxide (AZO), Fluorine Tin Oxide (FTO), graphene, poly (3,4-ethylenedioxy thiophene): poly(styrene sulfonate) (PEDOT:PSS), Ag nanowire, Cu nanowire, and a combination thereof; or from the group of ITO, FTO, PEDOT:PSS, and a combination thereof; or from the group of ITO, FTO and a combination thereof.

The present invention can utilize a variety of hole-transport layer materials widely used in photovoltaic industry. In certain embodiments, the hole-transport layer in the solar device according to the invention has a material selected from the group of poly (triaryl amine) (PTAA), PEDOT:PSS, NiOx, 2,2',7,7'-Tetrakis[N,N-di(4-methoxy phenyl)amino]-9,9'-spirobifluorene (Spiro-OMeTAD), and a combination thereof: or from the group of PTAA, NiOx, Spiro-OMeTAD and a combination thereof, or PTAA.

The present invention may utilize a variety of lead-based perovskite compositions as the first photovoltaic functional layer (i.e., the perovskite functional layer). In certain embodiments, the perovskite functional layer in the solar device according to the invention contains perovskite crystal grains having an $[A^{+1}B^{+2} X^{-1}_3]$ structure, where the A-site ion is selected from the group of $FA^+$, $MA^+$, $Cs^+$, $Rb^+$, $EA^+$, $GA^+$, and a combination thereof, the B-site ion is selected from the group of $Pb^{2+}$, $Sn^{2+}$, $Ge^{2+}$ or compounds thereof, and X-site is selected from the group of $I^-$, $Br^-$, $Cl^-$, and a combination thereof. In some embodiments, the A-site ion is selected from the group of $FA^+$, $MA^+$, $Cs^+$, and a combination thereof; or from the group of $FA^+$, $MA^+$, and a combination thereof. In some embodiments, the B-site ion is selected from the group of $I^-$, $Br^-$, $Cl^-$, and a combination thereof; or from the group of $I^-$, $Br^-$, and a combination thereof. For example, the material of the perovskite functional layer may be selected from the group of $CsPb_{0.5}Sn_{0.5}I_3$, $FAPbI_3$, $MA_{0.25}FA_{0.75}PbI_{2.2}Br_{0.6}Cl_{0.2}$, $Cs_{0.02}FA_{0.96}MA_{0.02}PbI_{0.99}Cl_{0.01}$, $MAPb_{0.92}Sn_{0.08}I_3$, $(FA_{0.95}Ma_{0.05})_{0.95}$ $Cs_{0.05}Pb(I_{0.96}Br_{0.04})_3$, $Rb_{0.1}FA_{0.8}GA_{0.1}Pb_{0.6}Ge_{0.4}I_3$, and $(FA_{0.92} MA_{0.08})_{0.9} Cs_{0.1}Pb(I_{0.92}Br_{0.08})_3$.

The present invention may utilize a variety of electron-transport layer materials widely used in photovoltaic industry. In certain embodiments, the electron-transport layer in the solar device according to the invention includes a material selected from the group of $PC_{61}BM$, $C_{60}$, $SnO_2$, and a combination thereof: or from the group of PCBM, C60, and a combination thereof; or C60.

The present invention may utilize a variety of electrodes widely used in photovoltaic industry. In certain embodiments, the metal electrode in the solar device according to the invention includes a material selected from the group of Ag, Cu, Au, Al, W, Fe, Pt, and a combination thereof: or from the group of Ag, Cu, Au, Al, and a combination thereof; or Ag.

The present invention may utilize a variety of photovoltaic functional layer materials widely used in photovoltaic industry. In certain embodiments, the second photovoltaic functional layer in the solar device according to the invention includes a material selected from the group of a perovskite photovoltaic material (including but not limited to the perovskite material provided herein), a Si photovoltaic material, a CIGS photovoltaic material, a CdTe photovoltaic material, an organic photovoltaic material, and a combination thereof. In some embodiments, the second photovoltaic functional layer includes perovskite materials.

The present invention may utilize a variety of anti-reflection layer materials widely used in photovoltaic industry. In certain embodiments, the anti-reflection layer in the solar device according to the invention includes a material selected from the group of $MgF_2$, LiF, PDMS, and a combination thereof; or from the group of $MgF_2$, PDMS, and a combination thereof; or $MgF_2$.

In certain embodiments, the metal electrode in the solar device according to the invention is fabricated by depositing a metal material having a resistivity less than about $5\times10^{-7}$ $\Omega\cdot m$ (at 25° C.). For example, the metal electrode may be fabricated by vapor deposition (e.g., vacuum thermal evaporation). In some embodiments, the metal electrode is deposited on the surface of a solar device.

In certain embodiments, the at least one lead trapping layer covers the surface of the solar device, or is located in the interior of the solar device. By means of this, the at least one lead trapping layer can be integrated into the photovoltaic device, such that the at least one lead trapping layer will not affect device's original performances and is safer to use.

In certain embodiments, the at least one lead trapping layer contacts any of the following positions:
(1) only on the upper surface of the metal electrode;
(2) the top of the device and extends downwards (in the direction from the top to the bottom of the device) to wrap the side of the device;
(3) the periphery of the device; or
(4) the top and bottom of the device.

In certain embodiments, when the at least one lead trapping layer includes a conductive encapsulation resin, the at least one lead trapping layer contacts any of the following additional positions in addition to the above-mentioned positions (1)-(4):
(5) between the perovskite functional layer and the first hole-transport layer;
(6) on the upper and lower surfaces of the perovskite functional layer;
(7) around the perovskite functional layer; or
(8) between the first electron-transport layer and the metal electrode.

In some embodiments, the at least one lead trapping layer can contact only the above-mentioned position (4). In some embodiments, the at least one lead trapping layer contacts the above positions (1), (2) and (4). In some embodiments, the at least one lead trapping layer contacts all of positions (1) to (4). In some embodiments, the at least one lead trapping layer may further contact the above position (8); or both positions (7) and (8); or all of positions (5) to (8).

In some embodiments, the lead trapping layer may further have a glass cover on its surface when the layer is on the outside surface of the solar device.

Figure 3B:
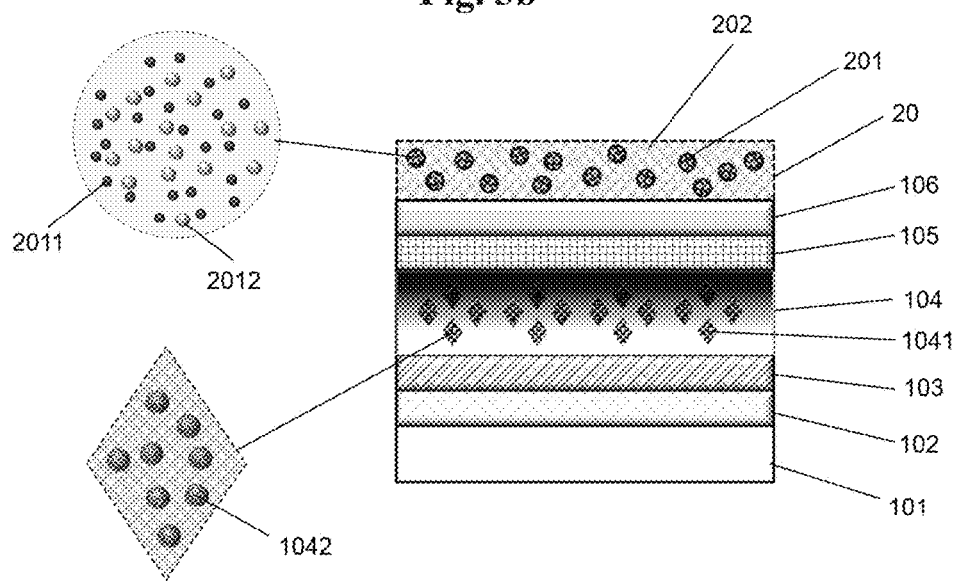
FIG. 3b shows an embodiment of the structure of p-i-n perovskite solar cells comprising lead-absorbing encapsulation structure of the present invention.

In an embodiment, the solar cell device has a structure as illustrated in FIG. 3b, in which glass, ITO, PTAA, $(FA_{0.92}MA_{0.08})_{0.9}Cs_{0.1}Pb(I0.92Br_{0.08})_3$, C60/BCP and Ag are used as 101—substrate layer, 102—transparent conductive layer, 103—hole-transport layer, 104—perovskite functional layer, 105—electron-transport layer and 106—metal electrode, respectively. The 20—lead trapping layer is a mixture of C100 and acrylate. FIG. 3b shows cations (2011) and acid ions (2012) in acid cation exchange resins, in which cations may be, for example, "$Na^+$". The cation (2011) together with the acid ion (2012) forms acid cation exchange resin (201). The lead ions (1042) are contained with perovskite crystal structure (1041) in the perovskite functional layer (104). Epoxy encapsulation resin (202) is applied to mix with acid cation exchange resin (201).

Figure 8:
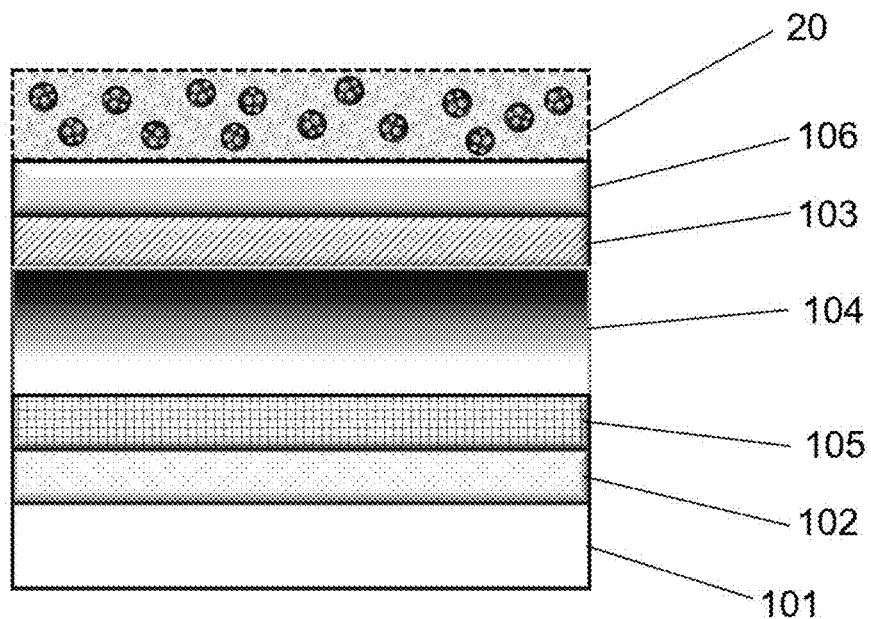
FIG. 8 shows an embodiment of lead-absorbing encapsulation structure of n-i-p perovskite solar cells, in which the lead trapping layer 20 is coated on the upper surface of the metal electrode 106.

In an embodiment, the solar cell device has a structure as illustrated in FIG. 8, in which PET, PEDOT: PSS, C60, $CsPb_{0.5}Sn_{0.5}I_3$, Spiro-OMeTAD, and Cu are used as the substrate layer 101, the transparent conductive layer 102, the electron-transport layer 105, the perovskite functional layer 104, the hole-transport layer 103 and the metal electrode 106, respectively. The lead trapping layer 20 composed of the acidic cation-exchange resin having a structure of formula I-1 (Purolite™ C100 in a $Na^+$ form) and acrylate is coated only on the upper surface of the metal electrode 106.

Figure 9:
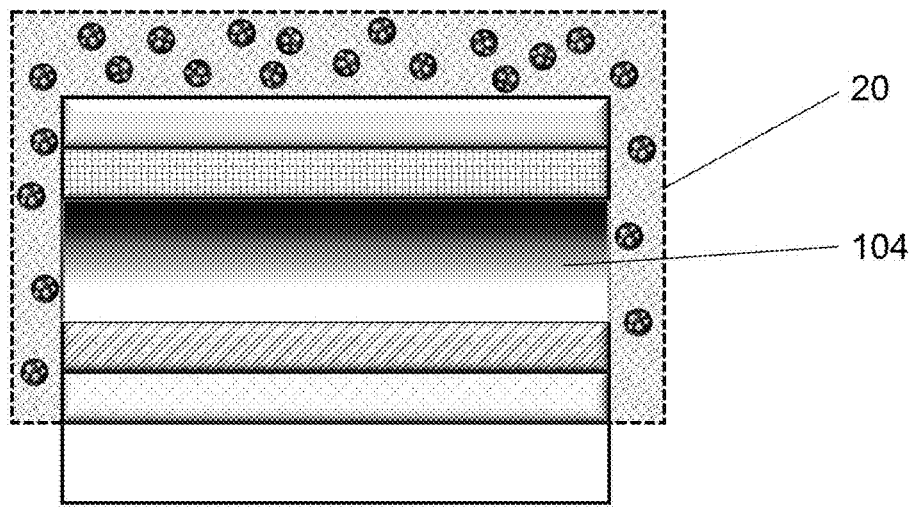
FIG. 9 shows an embodiment of lead-absorbing encapsulation structure of perovskite solar cells, in which the lead trapping layer 20 is extended from the top of the device downwards to wrap the side of the perovskite solar cells.

In an embodiment, the solar cell device has a structure as illustrated in FIG. 9, in which $FAPbI_3$ is used as the perovskite functional layer 104. The lead trapping layer 20 is extended from the top of the device downwards to wrap the side of the perovskite solar cell device to prevent the risk of $Pb^{2+}$ leakage from the side of the device when working in extremely harsh environments (or lateral penetration at the interface of each functional layer). As shown in FIG. 9, the substrate is not covered by the lead trapping layer 20.

Figure 10:
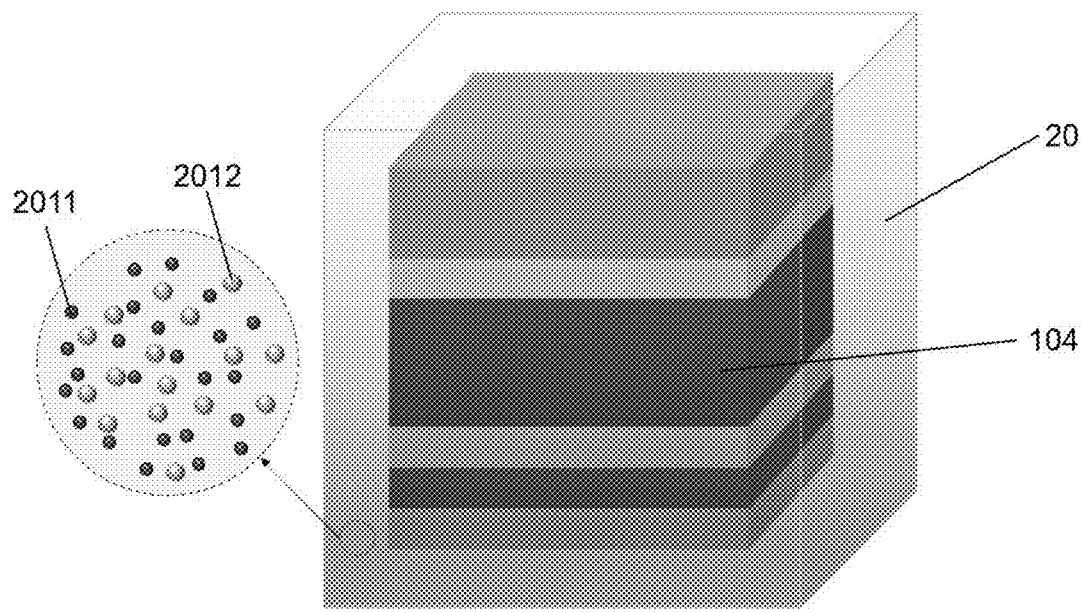
FIG. 10 shows an embodiment of lead-absorbing encapsulation structure of perovskite solar cells, in which the lead trapping layer 20 is completely coated on the periphery of the perovskite solar cells.

In an embodiment, the solar cell device has a structure as illustrated in FIG. 10, for which the "immersion" encapsulation protection is carried out. $MA_{0.25}FA_{0.75}PbI_{2.2}Br0.6Cl0.2$ is used as the perovskite functional layer 104. The lead trapping layer 20 containing cations (2011) and acid ions (2012) is completely coated on the periphery of the perovskite solar cell and encapsulates the cell. By such a way, the lead trapping layer according to the invention can achieve the function of trapping lead and also improve the water and oxygen barrier performance of the device, thereby enhancing the working stability of the device.

Figure 11:
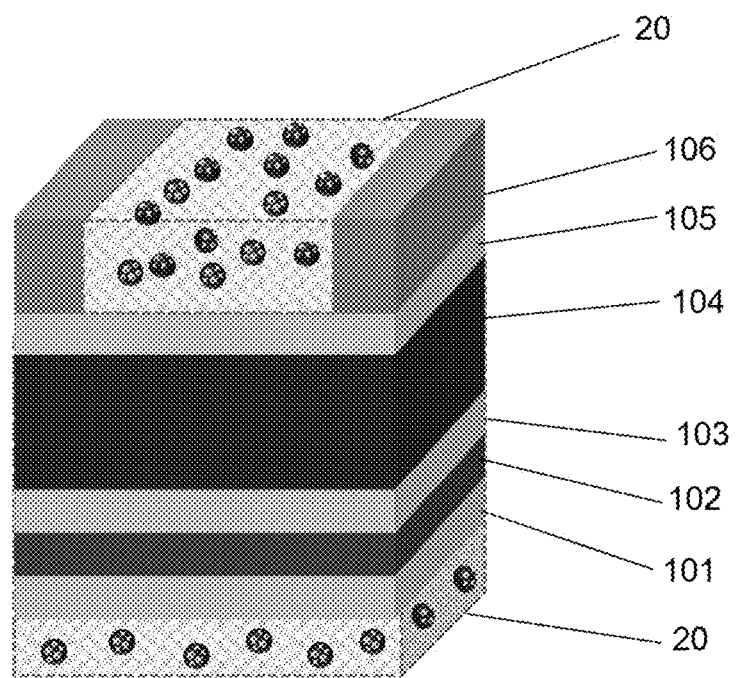
FIG. 11 shows an embodiment of lead-absorbing encapsulation structure of p-i-n perovskite solar cells produced by an upper and lower double-layer coating method, in which both the upper and lower layers of the device are coated with a layer of lead-adsorbent materials.

In an embodiment, the solar cell device has a structure as illustrated in FIG. 11, in which an upper and lower double-layer coating method is performed. Both the upper and lower layers of the device are coated with the lead trapping layer 20 to effectively solve the problem of $Pb^{2+}$ leakage from the bottom of the device. In addition, $Cs_{0.02}FA_{0.96}MA_{0.02}PbI_{0.99}Cl_{0.01}$ is used as the perovskite functional layer 104.

Figure 12:
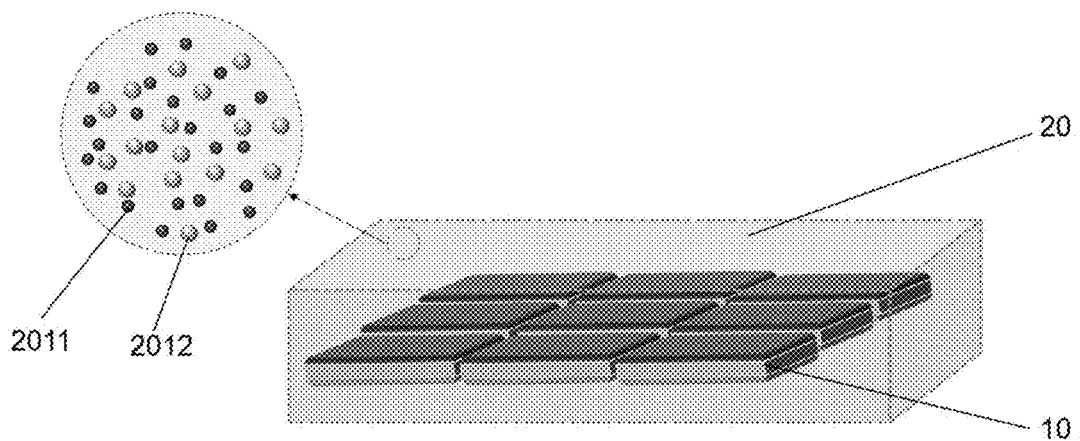
FIG. 12 shows an embodiment of lead-absorbing encapsulation structure of perovskite solar cell module, in which the perovskite solar cells 10 are assembled into a solar cell module, and then the lead trapping layer 20 is coated on the periphery of the module.

In an embodiment, the solar cell module has a structure as illustrated in FIG. 12. In particularly, a lead-absorbing encapsulation structure of Rigid/Flexible perovskite solar cell module is proposed. The lead trapping layer 20 is coated on the periphery of the module. In an embodiment, the Rigid/Flexible perovskite solar module may be fabricated as follows: a perovskite precursor solution is prepared by dissolving about 1098 mg $PbI_2$, about 92 mg $PbBr_2$, about 300 mg FAI, about 80 mg MAI in about 1 mL DMF: DMSO (about 1:1/v:v) mixed solvent in glovebox. Then, the perovskite precursor solution is meniscus-coated on the glass/ITO/HTL (the blading speed is about 10 mm s-1 and the distance between scraper and glass/ITO/HTL is about 100 μm). Next, glass/ITO/HTL or PET/ITO/HTL substrates coated with perovskite precursor are heat-annealed at about 100° C. for about 15 min on hotplate. Then, about 20 mg mL-1 PC61BM dissolved in anhydrous chlorobenzene is applied to form the ETL, subsequently. Finally, about 6 nm Bathocuproine (BCP) and about 120 nm argentum (Ag) metal electrode are deposited by vacuum evaporation under high vacuum (<4×10-6 Torr). There are four sub-cells on an ITO/glass substrate (about 50*50 mm$^2$). The length and width of one subcell are about 6.7 mm and about 49 mm, respectively. All the scribing techniques are performed by the rectification unit, and the dislocation of each layer was about 0.2 mm.

Figure 13:
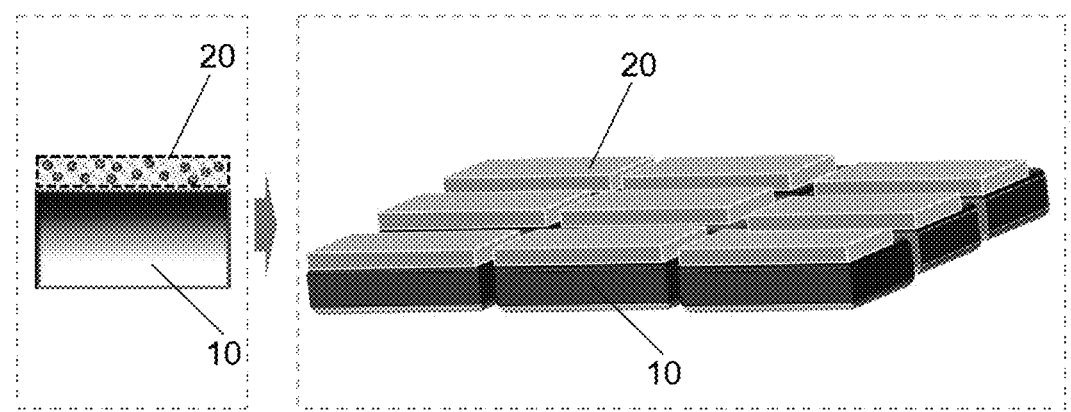
FIG. 13 shows an embodiment of lead-absorbing encapsulation structure of perovskite solar cell module, in which the lead trapping layer 20 is firstly coated on the upper surface of the metal electrode of devices, and then the device is assembled into a solar cell module.

In an embodiment, the solar cell module has a lead-absorbing encapsulation structure as illustrated in FIG. 13. The lead trapping layer 20 is coated on the upper surface of the metal electrode of devices 10, and then the devices are assembled into a solar cell module.

Figure 14:
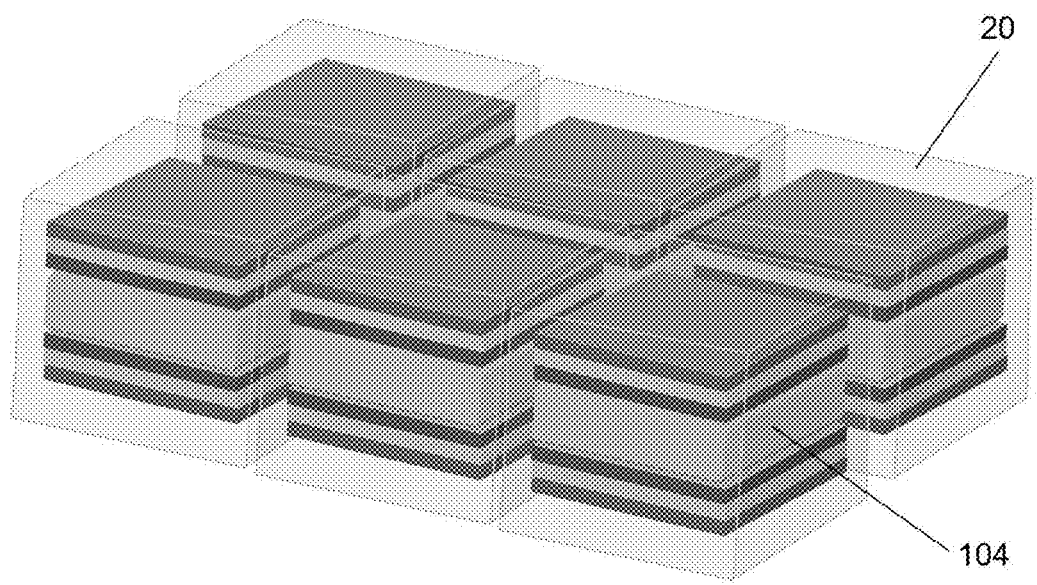
FIG. 14 shows an embodiment of lead-absorbing encapsulation structure of perovskite solar cell module, in which the lead trapping layer 20 is completely coated on the periphery of the perovskite solar cells, and then the coated device is assembled into a solar cell module.

In an embodiment, the solar cell module has a structure as illustrated in FIG. 14, in which the encapsulated devices obtained in FIG. 10 are assembled into the perovskite solar cell module.

Figure 15:
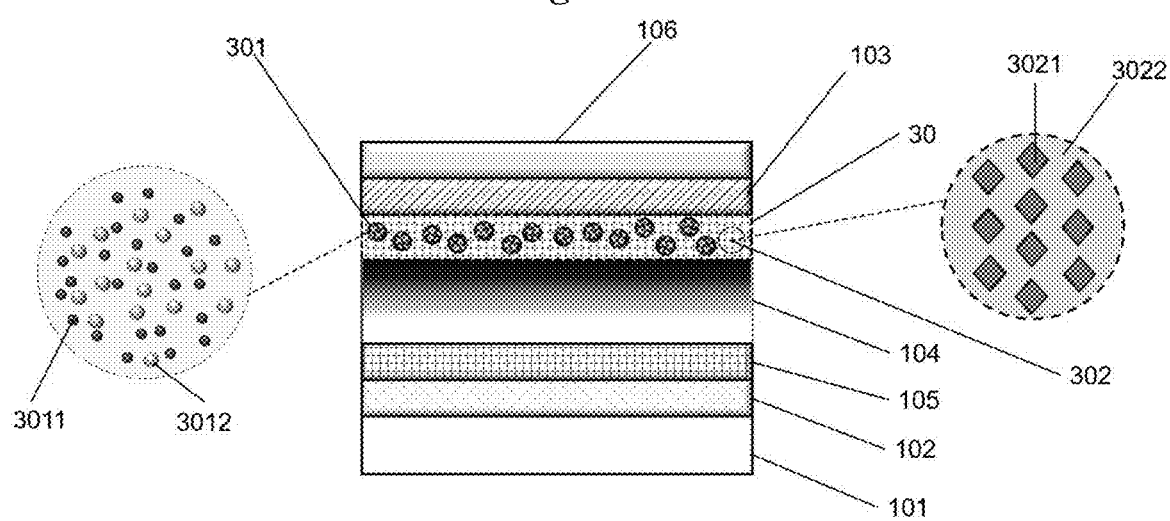
FIG. 15 shows an embodiment of lead absorbing encapsulation structure of n-i-p perovskite solar cells, in which the conductive lead trapping layer 30 is coated between the perovskite functional layer 104 and the hole transport layer 103.

In an embodiment, the solar cell device has a structure as illustrated in FIG. 15, in which PDMS, graphene, PC$_{61}$BM, MAPb$_{0.92}$Sn$_{0.08}$I$_3$, PTAA, and Au are used as the substrate layer 101, the transparent conductive layer 102, the electron-transport layer 105, the perovskite functional layer 104, the hole-transport layer 103 and the metal electrode 106, respectively. The conductive lead trapping layer 30 is coated between the perovskite functional layer 104 and the hole-transport layer 103. The conductive lead trapping layer 30 includes a trapping lead group 301 and a conductive encapsulation resin 302. The trapping lead group 301 includes substitute-lead positive ions 3011 and sulfonic acid groups 3012. The conductive encapsulation resin 302 includes a nanometer metal material 3021 and an encapsulation resin 3022. In this embodiment, the substitute-lead positive ion 3011 may be Ca$^{2+}$, the nanometer metal material 3021 may be nano-Ag and the encapsulation resin 3022 may be epoxy resin. Without intending to be limited by theory, it is believed that the addition of lead trapping material in the conductive layer can more quickly capture the possible leakage of lead. Because the package is in direct contact with the outside environment, there is a risk of further leakage of lead in the package. However, when the lead is trapped in the conductive layer, it is relatively more stable and less prone to secondary leakage.

Figure 16:
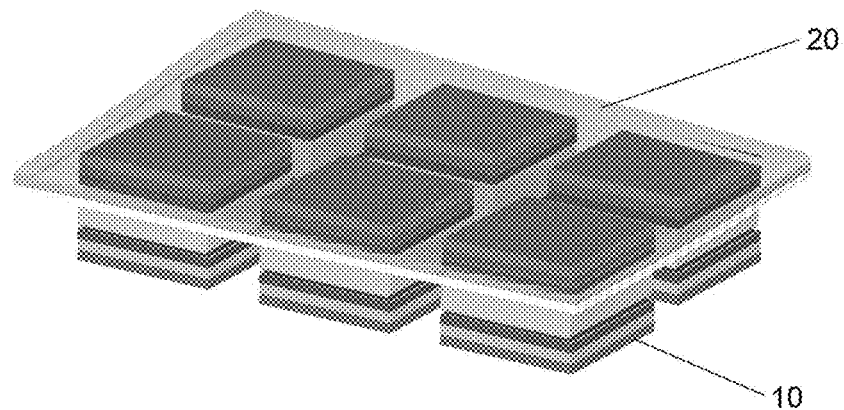
FIG. 16 shows an embodiment of lead-absorbing encapsulation structure of perovskite solar cell module, in which the perovskite solar cells 10 are assembled into a solar cell module, and the lead trapping layer 20 is coated on the upper surface (close to the metal electrode) of the module.

In an embodiment, the solar cell module has a structure as illustrated in FIG. 16, which provides another simple and low-cost trapping lead solution, i.e., first assembling the device 10 into a module, and then applying a lead trapping layer 20 on top of the module.

Figure 17:
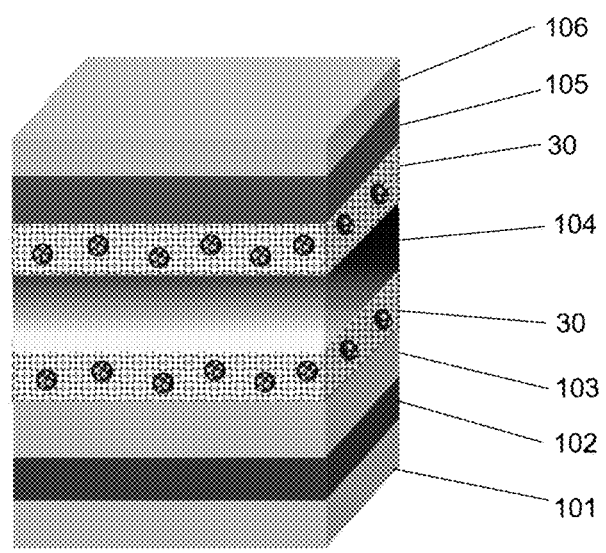
FIG. 17 shows an embodiment of lead-absorbing encapsulation structure of n-i-p perovskite solar cells, in which the conductive lead trapping layer 30 is coated on the upper and lower surfaces of the perovskite functional layer 104.

In an embodiment, the solar cell device has an encapsulation structure close to perovskite functional layer, as illustrated in FIG. 17. The conductive lead trapping layer 30 is coated on the upper and lower surfaces of the perovskite functional layer 104. In this embodiment, Glass, FTO, NiOx, (FA$_{0.95}$MA$_{0.05}$)$_{0.95}$Cs$_{0.05}$Pb(I$_{0.96}$Br$_{0.04}$)$_3$, C60/BCP and Cu may be used as the substrate layer 101, the transparent conductive layer 102, the hole-transport layer 103, the perovskite functional layer 104, the electron-transport layer 105 and the metal electrode 106, respectively. The features of the conductive lead trapping layer 30 depicted for FIG. 15 also apply here.

In an embodiment, the solar cell device has another type of encapsulation structure close to perovskite functional layer as illustrated in FIG. 18, in which the conductive lead trapping layer 30 is coated around the perovskite functional layer 104. In some embodiment, PETG, AZO, PEDOT:PSS, Rb$_{0.1}$FA$_{0.8}$GA$_{0.1}$Pb$_{0.6}$Ge$_{0.4}$I$_3$, C60/BCP and Al are used as the substrate layer 101, the transparent conductive layer 102, the hole-transport layer 103, the perovskite functional layer 104, the electron-transport layer 105 and the metal electrode 106, respectively.

In an embodiment, the solar cell device has a structure as illustrated in FIGS. 19a and 19b, in which the lead-absorbing encapsulation layer is close to the transport layer 105 of perovskite solar cells. In FIG. 19a, the conductive lead trapping layer 30 is coated between the electron-transport layer 105 and the metal electrode 106 of p-i-n perovskite solar cells. In FIG. 19b, the conductive lead trapping layer 30 is coated between the electron-transport layer 105 and the transparent conductive layer 102 of n-i-p perovskite solar cells.

Figure 20:
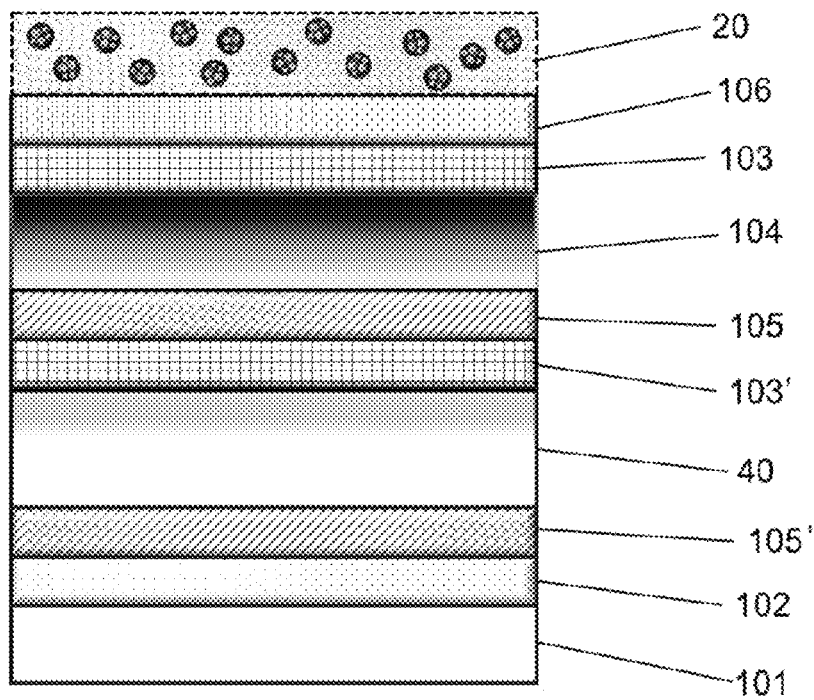
FIG. 20 shows an embodiment of tandem solar cells structure and lead-absorbing encapsulation, in which the lead trapping layer 20 is coated on the upper surface of the metal electrode 106 of the tandem solar cells.

In an embodiment, the solar cell device has a tandem solar cell structure as illustrated in FIG. 20. PDMS, graphene, PC$_{61}$BM, CIGS, MAPb$_{0.92}$Sn$_{0.08}$I$_3$, PTAA, and Au are used as the substrate layer 101, the transparent conductive layer 102, the first electron-transport layer 105, the photovoltaic functional layer 40, the perovskite functional layer 104, the first hole-transport layer 103 and the metal electrode 106, respectively. The second electron-transport layer 105' and the second hole-transport layer 103' have the same material as the first electron-transport layer 105 and the first hole-transport layer 103, respectively. The lead trapping layer 20 is coated on the upper surface of the metal electrode 106 of the tandem solar cells.

Figure 21:
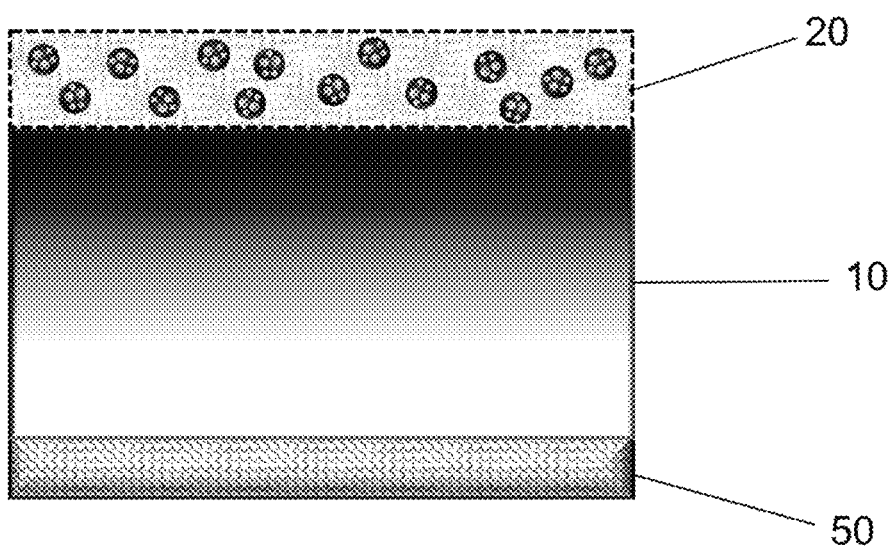
FIG. 21 shows an embodiment of lead-absorbing encapsulation structure of perovskite solar cells, in which the lead trapping layer 20 is coated on the upper surface of the metal electrode 106, and the anti-reflection layer 50 is coated on the surface of the substrate layer 101.

In an embodiment, the solar cell device has a structure as illustrated in FIG. 21, in which the lead trapping layer 20 is coated on the upper surface of the metal electrode 106, and the anti-reflection layer 50 is coated on the surface of the substrate layer (not shown, at the bottom of the device 10 as shown in, for example, FIG. 3b). In this embodiment, MgF$_2$ is used as the anti-reflection layer 50.

An embodiment of the present invention relates to a method of preparing the lead trapping layer according to the invention, which includes the steps of: mixing the acidic cation-exchange resin and the encapsulation resin under vigorous mechanical stirring to form a colloidal mixed resin; and applying the colloidal mixed resin to a position as needed, for example, a position selected from the group of:
(1) only on the upper surface of the metal electrode;
(2) from the top of the device extended downwards to wrap the side of the device;
(3) on the periphery of the device;
(4) on the upper and lower surfaces of the device;
(5) between the perovskite functional layer and the first hole-transport layer;
(6) on the upper and lower surfaces of the perovskite functional layer;
(7) around the perovskite functional layer; and
(8) between the first electron-transport layer and the metal electrode.

In some embodiments, the colloidal mixed resin is applied to only the above-mentioned position (4). In some embodiments, the colloidal mixed resin is applied to the above positions (1), (2) and (4). In some embodiments, the colloidal mixed resin is applied to all of positions (1) to (4). In some embodiments, the colloidal mixed resin may be further applied to the above position (8); or both positions (7) and (8); or all of positions (5) to (8).

In certain embodiments, the method above further includes the step of curing the mixed resin via UV light. In some examples, the mixed resin is subjected to curing via the UV light (at about 15 W to about 90 W, and from about 280 nm to about 395 nm) for about 3 to about 45 min. In some embodiments, the mixed resin is subjected to UV light of about 365 nm for about 5 to about 8 min. The UV light curing can solidify the resin to provide better encapsulation effect.

In certain embodiments, the acidic cation-exchange resin is ground into powder (e.g. about 60 to about 200 mesh) prior to the mixing step, which ensures the acidic cation-exchange resin well-mixed with the ultraviolet-cured encapsulation resin. By means of this, the acidic cation-exchange resin power can be evenly distributed in the UV-cured encapsulant to provide a better lead-trapping performance.

In certain embodiments, the powder of the acidic cation-exchange resin is dried at about 45° C. to about 120° C. for about 1 h to about 16 h prior to the mixing step. For example, the resin is dried at about 45° C. to about 70° C. for about 1 h to about 5 h. It is believed that the drying process of the powder is critical, since the moisture can erode the perovskite layer. The drying temperature should not exceed 120° C. The drying time depends on the drying temperature.

In certain embodiments, the encapsulation resin and the acidic cation-exchange resin are mixed in a weight ratio ranging from about 20:1 to about 200:1. For example, the weight ratio of the encapsulation resin to the acidic cation-exchange resin may be about 25:1, about 30:1, about 40:1, about 50:1, about 60:1, about 70:1, about 80:1, about 90:1, about 100:1, or about 150:1. It is believed that these ratios ensure the mixed encapsulant possesses both encapsulation and $Pb^{2+}$ trapping functions. The over dose of encapsulation resin or the acidic cation resin will break this balance.

In an embodiment, the acidic cation-exchange resin has the structure of formula (I-1), which is in the form of yellowish microbeads with a particle size range from about 100 μm to about 1600 μm (prior to grounding into powder). To ensure the acidic cation-exchange resin well-mixed with the ultraviolet-cured resins, it needed to be ground into powder by the grinder prior to use. The powder as prepared should be dried at about 45° C. to about 120° C. for about 1 to about 16 h, and then directly transferred to the nitrogen glovebox before use. For example, the powder is dried at about 45° C. to about 70° C. for about 1 h to about 5 h. The power of resin having formula (I-1) is physically mixed with ultraviolet-cured resin (UVR) under vigorous mechanical stirring till that the yellowish colloidal mixed resin was formed (UVR-C). Then, the UVR-C was rubbed firmly on the bottom sides of the perovskite device with the 1.1 mm-glass substrate cover. Subsequently, the devices are transferred to cure under the UV light for about 3 min to about 45 min for sealing, for example, for about 5 min to about 20 min, or from about 5 min to about 10 min In some embodiments, the UVR-C film may have a thickness of about 300 to about 1200 μm; or from about 325 μm to about 1100 μm. For example, it may have a thickness of about 350 μm, about 500 μm, about 750 μm, or about 1000 μm.

An embodiment of the present invention relates to a method of preparing a perovskite solar cell, including the following steps: providing a substrate; depositing the substrate with a transparent conductive layer; cleaning and drying the deposited substrate; coating a hole-transport layer on to the transparent conductive layer; coating a perovskite functional layer onto the hole-transport layer; and thermally evaporating an electron-transport layer and a metal electrode.

In an embodiment, the transparent conductive layer has a resistance of about 5 $\Omega sq^{-1}$ to about 70 $\Omega sq^{-1}$, for example, from about 5 $\Omega sq^{-1}$ to about 20 $\Omega sq^{-1}$, or from about 5 $\Omega sq^{-1}$ to about 15 $\Omega sq^{-1}$. It is believed that the resistance of less than about 5 $\Omega sq^{-1}$ will affect the transparency of the conductive layer, and the resistance higher than about 70 $\Omega sq^{-1}$ will affect the charge transfer of the devices.

In an embodiment, the substrate deposited with the transparent conductive layer is sequentially cleaned by sonication with detergent, deionized water, acetone, and isopropyl alcohol for about 15 min to about 90 min, respectively. Then, the substrate is dried at about 40° C. to about 125 ° C. in oven for over about 1 h. The cleaned and dry substrate is treated with oxygen plasma for about 10 min to about 75 min and then transferred into a $N_2$-filled glovebox before use.

In an embodiment, the hole-transport solution is spin-coated onto the transparent conductive layer at about 1000 rpm to about 10000 rpm for 5 s to about 90 s and the substrate is subsequently annealed at about 75° C. to about 180° C. for about 5 min to about 90 min to form the hole-transport layer. It is believed that the spinning rate, times, and annealing temperature may affect the hole-transport layer's formation, thickness and conductivity. In some embodiments, the spin-coating is performed at about 2000 rpm to about 8000 rpm for about 10~60 s, and the annealing temperature is from about 80 ° C. to about 150° C.

In an embodiment, a perovskite solution is spin-coated onto the hole-transport layer at about 300 rpm to about 12000 rpm for about 10 s to about 140 s. An antisolvent is slowly dripped onto the center of film at about 3 s to about 35 s before the end of spin-coating. It is believed that antisolvent treatment can increase the nucleus density during the film formation and thus is beneficial to produce uniform and pinhole-free perovskite film. The as-prepared perovskite film is subsequently transferred to the hotplate at about 65° C. to about 180° C. for about 6 min to about 120 min. The spin-coating processes are all conducted when the substrate and film are cool down at room temperature. The spinning rate, times, and annealing temperature may affect the perovskite film formation and device efficiency. In some embodiments, the perovskite solution is spin-coated at a rate of about 5000 rpm for 30 s, and the annealing temperature range is from about 100° C. to about 150° C., for example, from about 100° C. to about 120° C., or from about 100° C. to about 110° C.

In an embodiment, the electron-transport layer and the metal electrode are deposited by thermal evaporation under high vacuum (<about $5\times10^{-6}$ Torr). It is believed that high vacuum is critical for depositing the metal in accurate thickness. The vacuum should be at least about $1\times10^{-5}$ Torr for this purpose.

An embodiment of the present invention relates to a method of preparing a rigid or flexible perovskite solar module, including the following steps: coating a perovskite precursor solution on a stack of substrate/a transparent conductive layer/a hole-transport layer; heating the coated stack; forming an electron-transport layer; and depositing a metal electrode. By coating the stack with the perovskite layer, the electron-transport layer and the electrode, an entire perovskite solar cell enabling the charge transfer is formed. The perovskite precursor solution contains the perovskite material that used to form the perovskite functional layer as described herein.

In an embodiment, the perovskite precursor solution is meniscus-coated on the substrate layer/the transparent conductive layer/the hole-transport layer. Next, the substrate coated with the perovskite precursor are heat-annealed at about 75° C. to about 200° C. for about 5 min to about 120 min. For example, the coated substrate is annealed at a temperature from about 75° C. to about 120° C. for about 10 min to about 100 min, or from about 90° C. to about 100° C. for about 20 min to about 40 min. It is believed that the heating process is beneficial to the perovskite crystallization, leading to high efficiency. In some embodiment, the annealing is performed at a temperature from about 100° C. to about 120 ° C. for about 30-60 min.

In an embodiment, the electron-transport layer is prepared by coating with electron-transport materials dissolved in anhydrous chlorobenzene. It is believed that the electron-transport layer plays a crucial role in extracting and transporting electron carries for photovoltaic devices.

The present invention provides an effective, facile, and economical encapsulation method by employing a highly acidic cation-exchange resin features bountiful acid groups such as sulfonic acid groups and phosphate groups in the encapsulant that can be used to suppress the lead leakage from PVSCs and PVSMs without affecting device performance.

EXAMPLES

Test Methods

In the examples, J-V measurement of the solar devices is conducted in $N_2$-filled glovebox at room temperature by using a Keithley 2400 source meter under simulated AM 1.5 G illumination with an intensity of 100 mW cm-2 from a solar simulator (Enlitech, SS-F5, Taiwan). J-V curves are measured in forward scan from −0.2 to 1.2 V, and in reverse scan from 1.2 V to −0.2 V, along with a scan step of 20 mV and a dwell time of 10 ms.

QE-R EQE system (EnLi Technology, Taiwan) is applied to carry out the EQE measurements.

The concentration of the Pb ions aqueous solution are determined by a PerkinElmer Optima™ 8000 ICP-OES instrument.

Toxicity characteristic leaching procedure (TCLP) experiment is first proposed by United States Environment Protection Agency. The standard procedure is shown as follow:
- Size reduction of perovskite solar modules/films: The PVSMs and perovskite films on both rigid and flexible substrates are firstly weighted and then crashed by blender to obtain the particles <1 cm or less.
- Extraction by TCLP fluid: Following the size reduction, the rigid particles are transferred to the 500 mL centrifuge tubes, the flexible particles are transferred to the 50 mL centrifuge tubes. Extraction fluid is then added in a 20:1 ratio by weight extraction fluid to solids. The TCLP Extraction fluid is then added in a 20:1 ratio by weight extraction fluid to solids. Then the mixture is transferred to the agitator rotated for over 18 h.
- Filtration and ICP-OES analysis: Following the extraction, the mixture is filtered through a 0.22-µm membrane and analyzed using ICP-OES to determine the remaining Pb (II) content. Lead (II) acetate solutions of various Pb (II) concentrations (15, 10, 25, 50, 100, 250, 500, 750 and 1000 mg L-1) are prepared using D.I. water to be concentration standards.

Example 1

Test of Lead Adsorption Ability

The lead adsorbing ability of C100 powder is quantified by the sorption kinetics (using Lagergren's first-order equation) and sorption isotherm measurements (FIGS. 1a, b). A distribution coefficient $K_d$ of $1.67 \times 10^6$ mL g$^{-1}$, a maximum sorption capacity of 657.89 mg g-1 for $Pb^{2+}$ in aqueous solution and a sorption rate constant (pseudo first-order) of 0.23 min$^{-1}$ can be extracted and calculated, which indicates that the C100's great capability in minimizing the lead leakage from the degraded perovskites through effective cation exchange reaction.

The properties of C100 powder are listed in Table 1 below:

| Supplier | Purolite ® |
| --- | --- |
| Polymer Structure | Gel polystyrene crosslinked with divinylbenzene |
| Functional Group | Sulfonic Acid |
| Ionic Form | Na$^+$ form |
| Moisture Retention | 30~58% (Na$^+$ form) |
| Particle Size Range | 100~1600 µm |
| Reversible Swelling, Na$^+$ → H$^+$ (max.) | 9% |
| Specific Gravity | 1.29 |
| Shipping Weight (approx.) | 800~840 g/L (50.0~52.5 lb/ft$^3$) |
| Temperature Limit | 120° C. (248.0° F.) |

Figure 2:
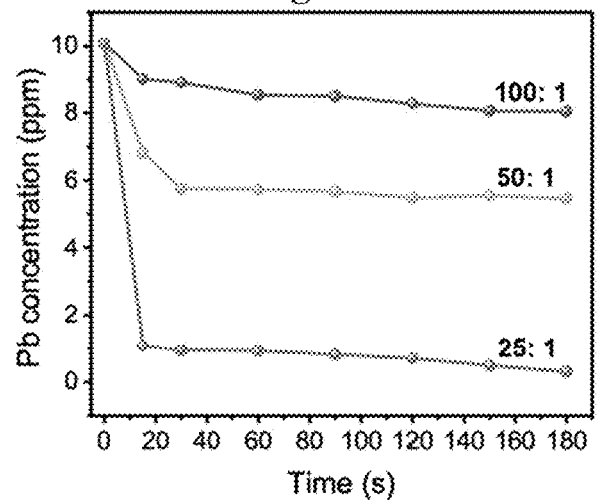
FIG. 2 shows the temporal $Pb^{2+}$ concentration profile of the glass substrates covered with UVR/C100 mixture with different weight ratio (25:1, 50:1, and 100:1) soaked in the aqueous solution of $PbI_2$, in which the initial concentration of $PbI_2$ solution is 10 ppm.

Apart from measuring its lead-adsorbing capability, the adsorption rate of the C100 mixed with UVR is also investigated. The UVR-C film is prepared on the 1.5×1.5 cm$^2$ glass substrates with different weight ratio (UVR:C100 =25:1, 50:1, 100:1, respectively), and then soaked into the lead iodide ($PbI_2$) aqueous solution, with the time-dependent Pb2+ concentration in the solution recorded (FIG. 2). The thickness of the UVR-C film has a thickness of about 300 to about 1200 µm.

To simulate the total degradation of perovskite solar cells, six pristine lab-scale PVSCs with an area of 2.25 cm$^2$ for each device are immersed in 14 mL D.I. water for using as a reference to determine the Pb2+concentration in contaminated water after degradation. The six PVSCs are inverted (p-i-n) structured (indium tin oxide (ITO)/Poly[bis(4-phenyl)(2,4,6-trimethylphenyl)amine](PTAA)/perovskite/C60/ Bathocuproine (BCP)/Ag), in which the perovskite is $(FA_{0.92}MA_{0.08})_{0.9}Cs_{0.1}Pb(I_{0.92}Br_{0.08})_3$. The process of preparing the PVSCs is described in detail in Example 2 hereinafter. This information will be applied for evaluating the lead adsorption rate of UVR-C films hereafter. As measured by an inductively coupled plasma optical emission spectroscopy (ICP-OES), the $Pb^{2+}$ concentrations in the contaminated water ar 8.18 ppm, 7.94 ppm, 7.79 ppm, 8.23 ppm, 7.98 ppm, 7.83 ppm for the six PVSCs devices, respectively, with an average $Pb^{2+}$ concentration of ~8 ppm, which is equivalent to ~0.11 mg of lead in a 2.25 cm$^2$ sized perovskite solar cell.

Figure 1C:
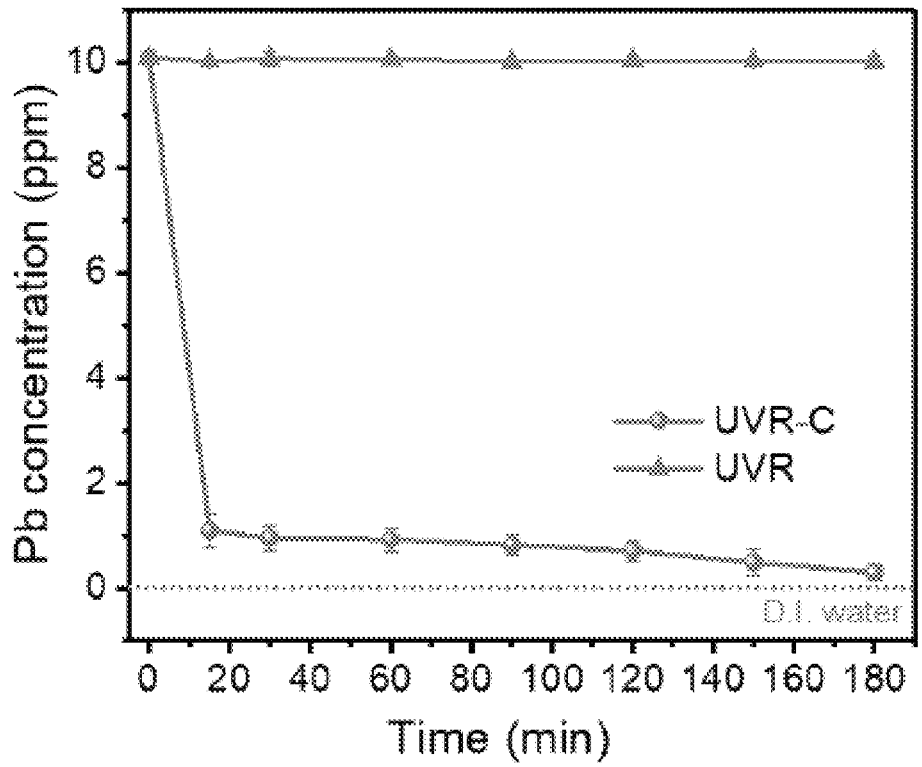
FIG. 1c shows a temporal $Pb^{2+}$ concentration profile of the glass substrates covered with appropriate weight ratio (25:1) of mixture of C100/UVR, and pure UVR in 10 ppm $PbI_2$ aqueous solution respectively according to Example 1.

To evaluate whether the UVR-C film can effectively adsorb $Pb^{2+}$ when a PVSC with a similar area is degraded, an even stringent condition of ~10 ppm aqueous solution of $PbI_2$ is used to measure the adsorption rate of the UVR-C films. FIG. 1c shows the temporal $Pb^{2+}$ concentration profile of the UVR-C films with the weight ratio (25:1) and UVR on glass substrates soaked in ~10 ppm $PbI_2$ aqueous solution for 180 min. The dash line represents the $Pb^{2+}$ concentration of D.I. water (0.017 ppm), which is the background $Pb^{2+}$ concentration. Within 15 min, ~90% of $Pb^{2+}$ can be adsorbed by the UVR-C film, with the lead concentration decreased from 10.08 ppm to 1.09 ppm and further decreased to 0.29 ppm after 180 min. The lead sorption rates of UVR-C films with different weight ratios of UVR/C100 (25:1, 50:1, and 100:1) are also measured and presented in FIG. 2, showing that 25:1 is the optimum concentration for achieving the highest lead sorption rate. In comparison, the PVSCs encapsulated with pure UVR do not adsorb lead in the $PbI_2$ solution, which confirms the effectiveness of incorporating cation exchange resin in the encapsulant.

Besides evaluating the lead-adsorbing capability of UVR-C film on a neat glass, the inventors also study the on-device lead sequestration capability of UVR-C film. Three types of lab-scale PVSCs are prepared for the following tests: (1) a control device without encapsulation; (2) a device encapsulated with UVR on both the glass and metal sides; (3) a device encapsulated with UVR-C on the metal-side and with UVR on the glass-side. The control device has the p-i-n structure ITO/PTAA/perovskite/C60/BCP/Ag as mentioned above, the other two devices have additional UCR or UVR-C films. The as-prepared devices are forcefully shattered by a hammer, then soaked into 14 mL D.I. water at room temperature (RT) and 70° C. (to enhance the $Pb^{2+}$ leakage rate), respectively. The temporal $Pb^{2+}$ concentration profile of all the samples for 180 min is recorded.

Figure 1D:
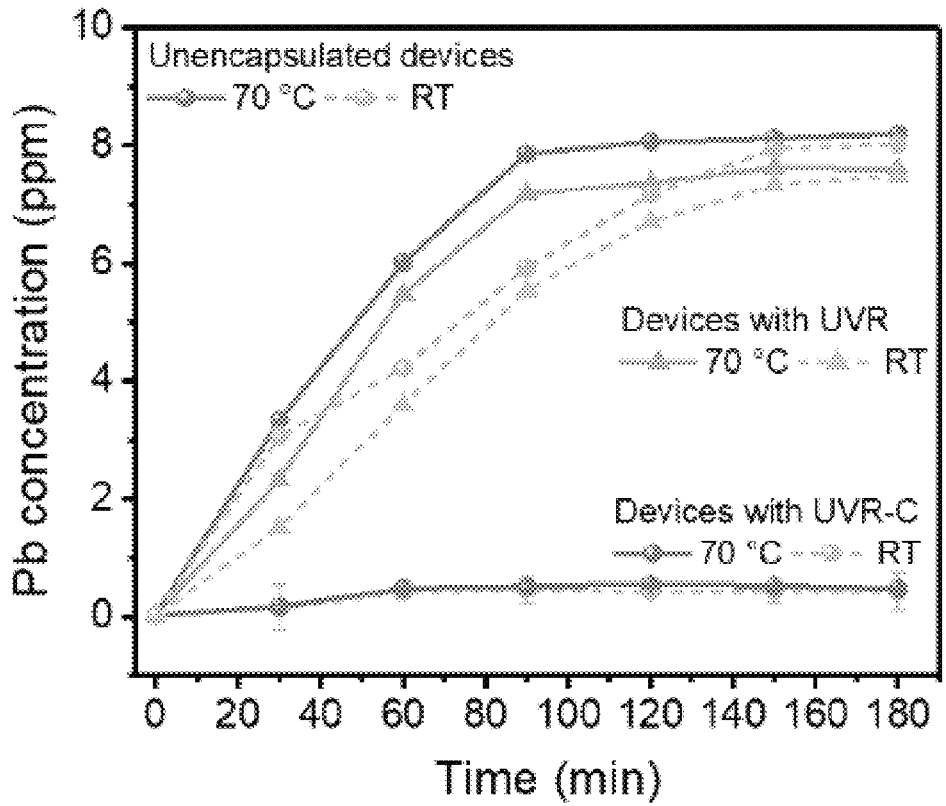
FIG. 1d shows a temporal $Pb^{2+}$ concentration profile of the damaged control PVSC and the PVSCs with UVR and UVR-C soaked in 2 mL D.I. water at room temperature and 70° C. according to Example 1.

As shown in FIG. 1d, the $Pb^{2+}$ concentration of the corresponding aqueous solution maintained at a low value within 180 min for the device coated with UVR-C film, with merely about 0.5 ppm at both room temperature and 70° C., which proves the excellent ability of UVR-C films in preventing $Pb^{2+}$ from leaching out. While the control device and the device encapsulated with UVR shows a similar leaking trend as those in the D.I. water. The $Pb^{2+}$ concentration for the control device is detected to be 8.02 ppm at room temperature and 8.19 ppm at 70° C. in aqueous solution, respectively. Similarly, for the device encapsulated with UVR, $Pb^{2+}$ concentrations are slightly lower with 7.48 and 7.59 ppm at room temperature and 70° C., respectively, due to the encapsulation of the resin and the glass.

Example 2

Fabrication of Solar Device

An inverted (p-i-n) structured lab-scale PVSC (2.25 $cm^2$) having a structure as shown in FIG. 3b is prepared, wherein glass, ITO, PTAA, $(FA_{0.92}MA_{0.08})_{0.9}Cs_{0.1}Pb(I_{0.92}Br_{0.08})_3$, C60/BCP and Ag are used as 101—substrate layer, 102—transparent conductive layer, 103—hole-transport layer, 104—perovskite functional layer, 105—electron-transport layer and 106—metal electrode, respectively. The 20—lead trapping layer is a mixture of C100 and acrylate.

The manufacturing method of the perovskite solar cells is as follows: ITO glass substrates (15 Ωsq-1) are sequentially cleaned by sonication with detergent, deionized water, acetone, and isopropyl alcohol for 20 min, respectively. Then, the ITO glass substrates are dried at 85° C. in oven for over 3 h. The cleaned and dry ITO glass substrates are treated with oxygen plasma for 25 min and then transferred into a $N_2$-filled glovebox before use. The PTAA solution (2 mL-1 in toluene) is spin-coated onto the ITO substrates at 5000 rpm for 30 s and the substrates are subsequently annealed at 100° C. for 10 min. The perovskite precursor solution is prepared by mixing CsI, FAI, MABr, $PbI_2$ and $PbBr_2$ in DMF:DMSO (4:1/v:v) with a chemical formula of $(FA_{0.92}MA_{0.08})_{0.9}Cs_{0.1}Pb(I_{0.92}Br_{0.08})_3$, and then 10 mol% MACl is added into the perovskite precursor solution stirring for 4 h. The perovskite solutions are spin-coated onto glass/ITO/PTAA at 1000 rpm 5 s, 5000 rpm for 30 s. 200 μL chlorobenzene (CB) is slowly dripped onto the center of film at 8-10 s before the end of spin-coating. The as-prepared perovskite films are subsequently transferred to the hotplate at 100° C. for 30 min. The spin-coating processes are all conducted when the substrates and films are cool down at room temperature. Finally, 20 nm C60, 6 nm BCP and 100 nm silver electrode is thermally evaporated under high vacuum (<4×10$^{-6}$ Torr).

Figure 4:
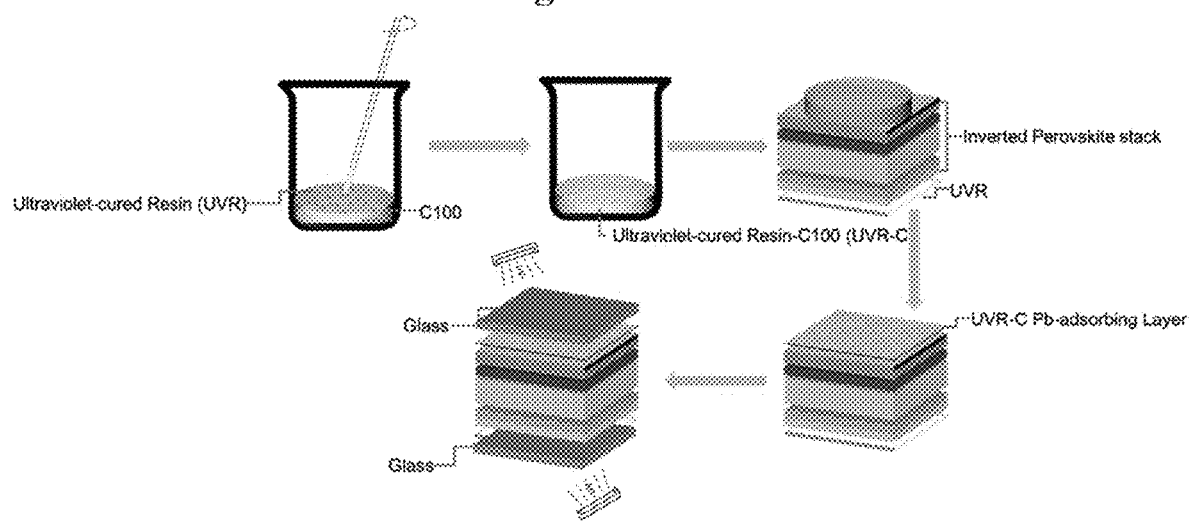
FIG. 4 shows a schematic diagram of the encapsulation process of the perovskite solar cells and modules with UVR-C as encapsulant.

The encapsulation method of FIG. 3b by applying trapping lead materials in the encapsulation architecture is as follows: the C100 is in the form of yellowish microbeads with a particle size range from 300-1200 μm. To ensure the C100 well-mixed with the ultraviolet- cured resins, it needs to be ground into powder by the grinder prior to use. The moisture retention of the C100 can reach 44-48%, as-prepared powder should be dried at 70° C. for 5 h, and then directly transferred to the nitrogen glovebox before use. As shown in FIG. 4, the C100 power is physically mixed with ultraviolet-cured resin (UVR) in a ratio of about 1:50 under vigorous mechanical stirring that the yellowish colloidal mixed resin is formed (UVR-C). Then, the UVR-C is rubbed firmly on the bottom sides of the perovskite device with the 1.1 mm-glass substrate cover. Subsequently, the devices are transferred under the UV light (40 W, 365 nm) curing for 5-8 min for sealing.

Example 3

Impact of Encapsulation on the Photovoltaic Performance and Stability of Perovskite Solar Device The device prepared in Example 2 is used to systematically evaluate the influence of encapsulation on photovoltaic performance of devices. In addition, another two types of devices are prepared: one only differs from Example 2 in replacing the UVR-C of the lead trapping layer to UVR; and the other does not have the lead trapping layer (control device).

FIG. 5a-c show the J-V curves in forward and reverse scans, the corresponding external quantum efficiency (EQE) spectra, and the stabilized-power-output (SPO) spectra at maximum power point (MPP) for control device and devices with UVR and UVR-C, respectively. The overlap profiles of both the J-V curves and EQE indicate that the encapsulation with UVR-C does not cause any negative impact on the photovoltaic performance of devices. The detailed photovoltaic parameters and the statistics distribution of devices are listed in Table 2.

TABLE 2

Photovoltaic performance of control PVSC and PVSCs with UVR and UVR-C, respectively

|  | $V_{OC}$ (V) | $J_{SC}$ (mA cm$^{-2}$) | FF | PCE (%) |
| --- | --- | --- | --- | --- |
| Control-forward scan | 1.14 | 22.70 | 0.80 | 20.70 |
| Control-reverse scan | 1.13 | 22.71 | 0.81 | 20.79 |
| UVR-forward scan | 1.14 | 22.74 | 0.80 | 20.73 |
| UVR-reverse scan | 1.13 | 22.71 | 0.81 | 20.78 |
| UVR-C-forward scan | 1.14 | 22.74 | 0.81 | 21.00 |
| UVR-C-reverse scan | 1.13 | 22.70 | 0.80 | 20.52 |

In addition, the long-term stability of the three types of devices is tested in ambient air for over 500 h (FIG. 5d). There is no obvious degradation of efficiency for devices encapsulated with UVR-C, similar to those coated with UVR. However, the efficiency of the control device decreased dramatically to ~40% of its initial value after 500 h. These results indicate that the optimal UVR/C100 resin mixture can maintain similar encapsulation efficiency as pure UVR encapsulant on device performance and long-term stability.

In addition, the p-i-n perovskite solar modules (5×5 cm$^2$) with a structure of ITO/poly(3,4-ethlenedioxythiophene) polystyrene sulfonate(PEDOT:PSS)/Perovskite/PC61BM/BCP/Ag are also employed to further examine the general applicability of the encapsulation with UVR-C. The results are shown in Table 3 below. The perovskite layer is fabricated with the same process as Example 2.

TABLE 3

Photovoltaic performance of control PVSM and PVSMs with UVR and UVR-C as encapsulants, respectively.

|  | $V_{OC}$ (V) | $J_{SC}$ (mA cm$^{-2}$) | FF | PCE (%) |
| --- | --- | --- | --- | --- |
| Control | 4.67 | 4.81 | 0.66 | 14.83 |
| UVR | 4.67 | 4.80 | 0.67 | 15.01 |
| UVR-C | 4.67 | 4.80 | 0.68 | 15.24 |

Example 4

Simulating Perovskite Solar Modules Under Severe Weather Conditions

Perovskite solar modules having the structure as shown in FIG. 13 are prepared according to Example 2, with the only difference that the modules have an area of 25 cm$^2$.

A simulation of hail impact is conducted by mechanically breaking the encapsulated PVSMs by dropping a metal ball with a specific size on top of the device by following the protocol of the Approval Standard for Photovoltaic Modules ("Approval Standard for Rigid Photovoltaic Modules (FM 44787)", https://www.fmapprovals.com/products-we-certify/understanding-the-benefits/fm-approved-photovoltaic-modules, Accessed: 18/02/2021). In particular, the metal ball with a diameter of 45 mm and weight of ~400 g is dropped on the PVSMs with a height of ~10 cm to simulate the hail impact according to the FM 44787 standard hail impact test. The unencapsulated pristine PVSM is broken into several pieces, in contrast, the PVSMs with the UVR and UVR-C as encapsulants showed star-shaped microcracks formed at the impact position, which is consistent with the phenomenon of typical hail-induced damage on commercialized solar modules (L. P. G. Mathiak, et al., 31st *European Photovoltaic Solar Energy Conference and Exhibition*, p. 1915, 2015). Such damaged PVSMs are used for further experiments under the conditions of acid rain and high humidity below:

Performances Under Acid Rain

To simulate the heavy acidic rainfall, acid water with a pH value of 4.2 is prepared and then dripping on the glass cover-side of the damaged PVSMs with a flowing rate of 5 mL h$^{-1}$ for 4 h (denoted as Test 1). The tilted angle of the PVSMs placed in the funnel is ~20° with the respect to the ground surface, which is the optimal tilt angle for the solar panels in Hong Kong with the region latitude of 22.4°. The contaminated water passed through the cracks of the devices is collected in a centrifuge tube. Meanwhile, six pristine PVSMs are immersed in 20 mL (similar to the volume of acid water that could be collected after Test) acid water for 3 h to determine the Pb$^{2+}$ concentration of fully dissolved perovskites, the mean Pb$^{2+}$ concentration of about 91.52 ppm is obtained, which can be applied as a reference to estimate whether the perovskites in the PVSMs are totally dissolved in Test 1. As shown in Table 4, 53.67 and 36.48 ppm of Pb$^{2+}$ is detected in the contaminated water for the pristine module and the module encapsulated with UVR, respectively in Test 1.

While the concentration of Pb$^{2+}$ leaked out from the module encapsulated with UVR-C is significantly reduced to 1.44 ppm, achieving a lead sequestration efficiency of 97.32% based on the previously reported calculation method (Xun Li, et al., On-device lead sequestration for perovskite solar cells, *Nature*, Vol. 578, pp.555-558, 2020).

Compared with the Pb$^{2+}$ concentration of the pristine devices soaked in 20 mL acid water, the dripping water in Test 1 is not able to fully dissolve the perovskites in all three types of PVSMs. To verify that the high lead sequestration efficiency of the PVSMs with UVR-C is due to the effective in-situ chemical adsorption of Pb$^{2+}$ rather than the increased mechanical strength with the resin and glasses cover, the degraded PVSMs after Test 1 are continuously soaked in 20 mL acid water and heated at 70° C. for 3 h to fully dissolve the residual perovskite (denoted as Test 2). As shown in Table 4, the Pb2+concentration for the UVR-C encapsulated PVSM immersed in the contaminated water remains to be very low (0.29 ppm). However, the Pb$^{2+}$ leaked into the water completely from the degraded perovskite of the pristine PVSM and the PVSM with UVR to show very high concentrations of 32.43 and 62.27 ppm, respectively. More than 98% lead leakage is prevented through the incorporation of UVR-C after the PVSMs went through Test 1 and Test 2 (summarized in Table 4). This further confirms that C100 is a desired lead adsorbing material for PVSCs and modules.

TABLE 4

Pb$^{2+}$ leakage of damaged PVSMs with acid water (pH = 4.2) dripping with a flow rate of 5 mL h$^{-1}$ for 4 h (Test 1). Then the degraded PVSMs are soaked in 20 mL acid water at 70° C. for 3 h (Test 2).

|  | Sample | Pb concentration in water (ppm) |
| --- | --- | --- |
| Test 1 | UVR-C | 1.44 |
|  | UVR | 36.48 |
|  | Control | 53.67 |
| Test 2 | UVR-C | 0.29 |
|  | UVR | 62.27 |
|  | Control | 32.43 |

Performances Under High Humidity

According to the data displayed in the Hong Kong Observatory, the annual average humidity in Hong Kong is ~78% ("Climate of Hong Kong", https://www.hko.gov.hk/en/cis/climahk.htm, Accessed: 10/10/2020). The potential Pb$^{2+}$ leakage should not be ignored when the PVSMs are operated in such a high humidity environment. In this case, six damaged PVSMs for each condition (control, UVR, UVR-C) are prepared and placed in petri dishes in an airtight environment with a constant humidity (RH-85%) for 7 days to monitor the lead leakage behaviors. About 2 mL contaminated water can be collected in the petri dish of each PVSM after 7 days, which are then subjected to Pb concentration test. The results show that, the PVSMs encapsulated with UVR-C has successfully prevented lead leakage under the high humidity environment, showing a very low Pb$^{2+}$ concentration (mean value: 0.59 ppm) in the contaminated water, compared with 90.21 and 143.12 ppm (mean values) for the UVR encapsulated PVSMs and the pristine device, respectively.

Example 5

Modulating Lead Leaching Behavior of Perovskite Photovoltaics for Regulatory and Market Access Although the benign lead adsorption capability of the UVR-C encapsulant for PVSCs under severe weather conditions is proven, the critical legal and regulatory framework compliance of the hazardous materials (Pb) for commercialized photovoltaic still needs to be evaluated. Two groups of devices are prepared: one is prepared using the process according to Example 2, and the other is prepared only differing from Example 2 in replacing the UVR-C (i.e., a mixed resin with C100 cation exchange resin added to UVR) of the lead trapping layer to UVR (i.e., ultraviolet resin).

The law and regulation of the hazardous materials restriction in photovoltaics have been established in many regions worldwide, such as the Restriction of hazardous Substances Directive Regulation (RoHS) in the Europe Union (Directive 2011/65/EU of the European Parliament and of the Council of 8 June 2011 on the restriction of the use of certain hazardous substances in electrical and electronic equipment Text with EEA relevance", http://data.europa.eu/eli/dir/2011/65/oj, Accessed: 15/01/2021), Resource Conservation and Recovery Act Regulation (RCRA) in the US, as well as analogous policies in East Asian region (P. Sinha, et al., Regulatory policy governing cadmium-telluride photovoltaics: A case study contrasting life cycle management with the precautionary principle, Energy Policy, Vol. 36, pp. 381-387, 2008), which target to lower the risk of harm caused by the hazardous materials, and all of the commercialized PVs must comply to these regulations and laws. Among them, RCRA, which regulates the hazardous waste based on leaching potential, is applied to evaluate whether our encapsulation method can reduce the lead content of PVSMs to match the standard for commercialization. To prove this, a mandatory protocol, Toxicity Characteristic Leaching Procedure (TCLP), is applied to determine the leaching potential. The procedure of TCLP is described herein above.

Since the RCRA incorporates the per-weight basis for waste processing through the addition of an acidic extraction fluid to the sample in a fixed ratio by weight, the lighter weight, flexible PVSMs are more likely to be obstructed compared with the traditional rigid modules. Therefore, flexible PVSMs with considerable photovoltaic performance are employed to test the universal application of the UVR-C for adsorbing lead (FIG. 6, Table 5). The flexible PVSMs have a flexible substrate of PET, and the other layers are the same as Example 4. The rigid and flexible modules with and without encapsulation with UVR-C are applied to the TCLP experiment for the first time.

TABLE 5

Photovoltaic performance of flexible control PVSM and PVSMs with UVR and UVR-C as encapsulants, respectively.

|  | $V_{OC}$ (V) | $J_{SC}$ (mA cm$^{-2}$) | FF | PCE (%) |
| --- | --- | --- | --- | --- |
| Control | 4.670 | 4.681 | 0.616 | 13.462 |
| UVR | 4.583 | 4.614 | 0.600 | 12.680 |
| UVR-C | 4.670 | 4.551 | 0.580 | 12.319 |

Figure 7A:
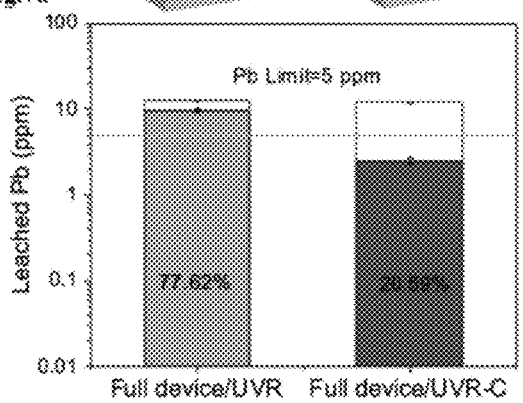
FIG. 7a shows an embodiment of lead leaching comparison of a rigid perovskite solar module on glass substrate with the UVR, and UVR-C as encapsulant under TCLP.
Figure 7B:
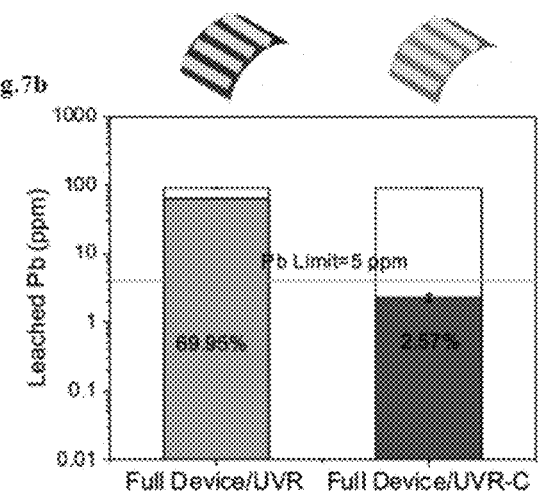
FIG. 7b shows an embodiment of lead leaching comparison of a flexible perovskite solar module on PET substrate with the UVR, and UVR-C as encapsulant under TCLP.
Figure 7C:
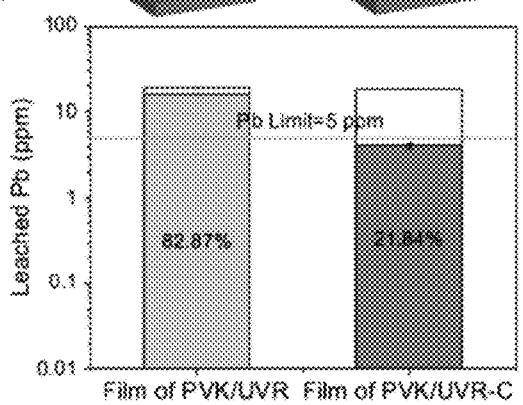
FIG. 7c shows an embodiment of lead leaching comparison of a perovskite thin film on glass with UVR, and UVR-C under TCLP.
Figure 7D:
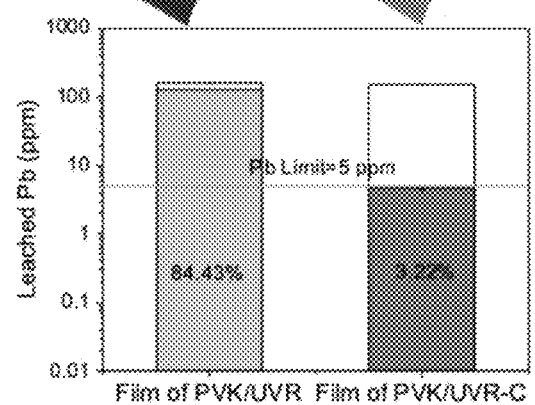
FIG. 7d shows an embodiment of lead leaching comparison of a perovskite thin film on PET with UVR, and UVR-C under TCLP.

As shown in FIGS. 7a, b, both of the UVR-C encapsulated rigid and flexible PVSMs can successfully reduce the Pb leaching to below the 5 ppm hazardous waste limit. In contrast, the rigid and flexible modules encapsulated with UVR Pb$^{2+}$ show leaching of 9.75 ppm, and 65.15 ppm, respectively. To confirm the low leaching percentage of UVR-C encapsulated PVSMs is due to the efficient cation exchange reaction rather than the additional weight brought by the glass covers, the perovskite films on both the rigid and flexible substrate with only the UVR or UVR-C are prepared for the TCLP experiment (FIGS. 7c, d). A significantly reduced Pb$^{2+}$ leaching to 5 ppm of the hazardous waste limit can also be achieved, with 4.06 ppm for perovskite film on the rigid substrate and 4.84 ppm on the flexible substrate, respectively. The data of the TCLP experiment shown in FIGS. 7a-7d are summarized and listed in Table 6.

TABLE 6

Experiment data of Toxicity Characteristic Leaching Procedure (TCLP) experiment

|  | 5 × 5 cm$^2$ Substrate |  | Total Pb available (ppm) | Weight (g) | TCLP extraction fluid (L) | Leaching Pb (ppm) | Pb leaching percentage |
| --- | --- | --- | --- | --- | --- | --- | --- |
| Perovskite/ UVR | Rigid (Glass) | Film | 19.27 | 7.42 | 0.15 | 15.97 | 82.87% |
|  |  | Device | 12.55 | 11.39 | 0.23 | 9.75 | 77.62% |
|  | Flexible (PET) | Film | 161.10 | 0.77 | 0.02 | 127.01 | 84.43% |
|  |  | Device | 92.88 | 1.39 | 0.03 | 65.15 | 69.95% |
| Perovskite/ UVR-C | Rigid (Glass) | Film | 18.55 | 7.71 | 0.15 | 4.06 | 21.84% |
|  |  | Device | 12.13 | 11.79 | 0.24 | 2.50 | 20.59% |
|  | Flexible (PET) | Film | 150.51 | 0.82 | 0.02 | 4.84 | 3.22% |
|  |  | Device | 89.49 | 1.39 | 0.03 | 2.30 | 2.57% |

It is further confirmed that the employment of UVR-C encapsulant is an efficient way for trapping Pb$^{2+}$ generated from the degraded perovskite, instead of just acting as a physical barrier in the encapsulation architecture. Besides, it also provides a pathway for both the rigid and flexible perovskite solar modules toward commercialization.

It should be understood that the above only illustrates and describes examples whereby the present invention may be carried out, and that modifications and/or alterations may be made thereto without departing from the spirit of the invention.

It should also be understood that certain features of the invention, which are, for clarity, described in the context of separate embodiments, may also be provided in combination in a single embodiment. Conversely, various features of the invention which are, for brevity, described in the context of a single embodiment, may also be provided separately, or in any suitable subcombination.

All references specifically cited herein are hereby incorporated by reference in their entireties. However, the citation or incorporation of such a reference is not necessarily an admission as to its appropriateness, citability, and/or availability as prior art to/against the present invention.

What is claimed is:

1. A lead trapping layer comprising a mixture comprising:
(a) an acidic cation-exchange resin comprising a formula selected from the group consisting of:

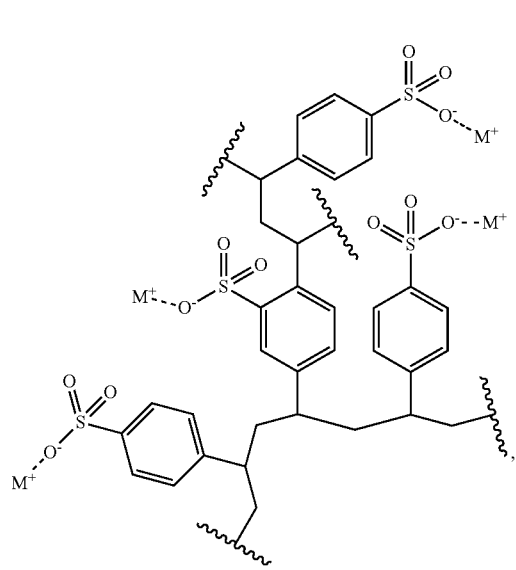
(I)

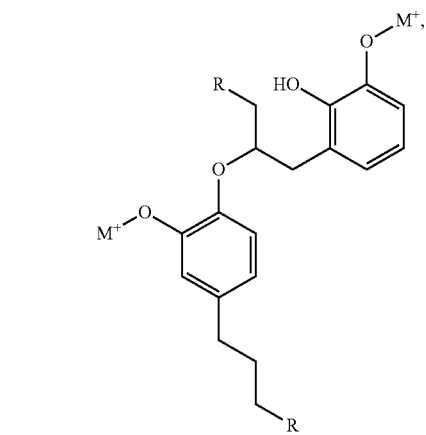
(II)

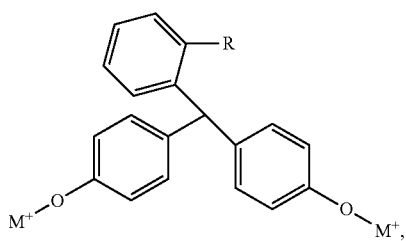
(III)

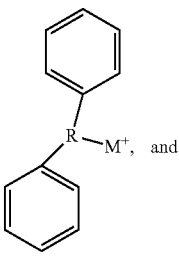
(IV)

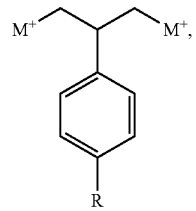
(V)

wherein
each $M^+$ is independently selected from the group consisting of $Sr^{2+}$, $Ca^{2+}$, $Ni^{2+}$, $Cu^{2+}$, $Co^{2+}$, $Zn^{2+}$, $Mg^{2+}$, $Ba^{2+}$, $K^+$, $NH_4^+$, $Na^+$, $H^+$, and $Li^+$; and
each R is independently selected from the group consisting of $SO_3H$, $CH_2SO_3H$, $PO_3H_2$, and COOH; and
(b) an encapsulation resin selected from the group consisting of an epoxy resin, a silicone resin, an acrylate resin, and a combination thereof.

2. The lead trapping layer of claim 1, wherein the encapsulation resin and the acidic cation-exchange resin are present in a weight ratio ranging from about 20:1 to about 200:1.

3. The lead trapping layer of claim 1, wherein the encapsulation resin comprises a conductive encapsulation resin comprising a nanometer metal material.

4. The lead trapping layer of claim 1, further comprising lead.

5. The lead trapping layer of claim 1, wherein the acidic cation-exchange resin has a structure of formula selected from the group consisting of:

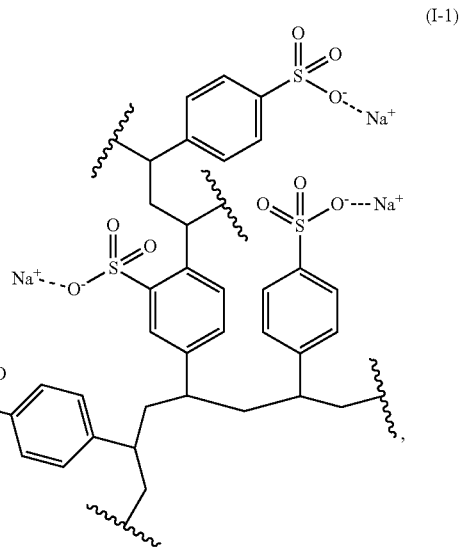
(I-1)

-continued

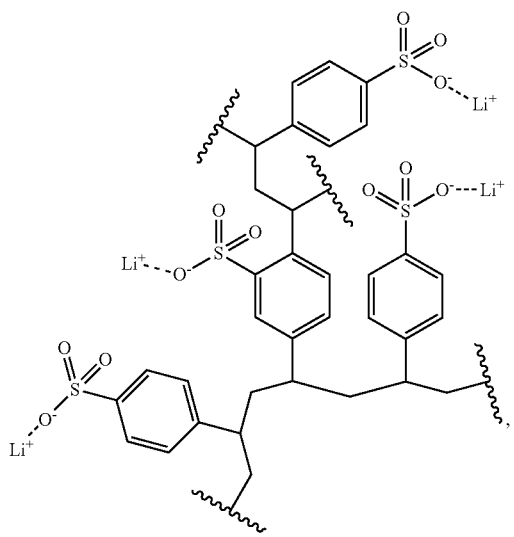

(I-2)

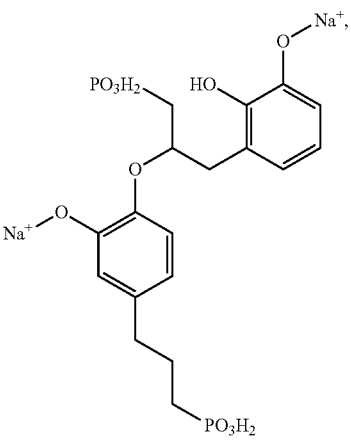

(II-1)

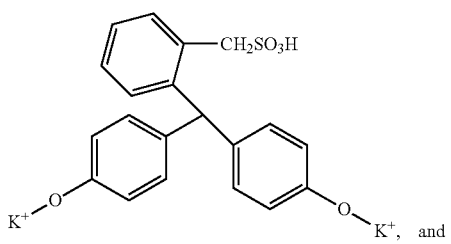

(III-1)

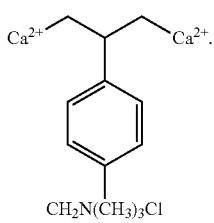

(V-1)

6. A solar cell device comprising at least one lead trapping layer of claim 1.

7. The solar cell device of claim 6, wherein the lead trapping layer comprises:
a trapping lead group having a substitute-lead positive ion selected from the group consisting of $Sr^{2+}$, $Ca^{2+}$, $Ni^{2+}$, $Cu^{2+}$, $Co^{2+}$, $Zn^{2+}$, $Mg^{2+}$, $Ba^{2+}$, $K^+$, $NH_4^+$, $Na^+$, $H^+$, and $Li^+$; and
an acid group selected from the group consisting of $SO_3H$, $CH_2SO_3H$, $PO_3H_2$, and COOH.

8. The solar cell device of claim 6, wherein the device comprises a periphery comprising a top, a bottom opposite the top, and a side between the top and the bottom, and comprises the following layers from the bottom to the top:
(1) a substrate layer comprising an upper surface and a lower surface;
(2) a transparent conductive layer comprising an upper surface and a lower surface;
(3) a first hole-transport layer comprising an upper surface and a lower surface;
(4) a first photovoltaic functional layer comprising an upper surface and a lower surface, wherein the first photovoltaic functional layer is a perovskite functional layer;
(5) a first electron-transport layer comprising an upper surface and a lower surface;
(6) a metal electrode comprising an upper surface and a lower surface; and
(7) the at least one lead trapping layer comprising an upper surface and a lower surface;
wherein the positions of the first hole-transport layer and the first electron-transport layer are exchangeable.

9. The solar cell device of claim 8, wherein the device further comprises:
(8) a second hole-transport layer comprising an upper surface and a lower surface;
(9) a second photovoltaic functional layer comprising an upper surface and a lower surface;
(10) a second electron-transport layer comprising an upper surface and a lower surface;
(11) wherein the positions of the second hole-transport layer and the second electron-transport layer are exchangeable; and an anti-reflection layer coated on the lower surface of the substrate.

10. The solar cell device of claim 9, wherein the device fullfills at least one of the following characters:
(1) the perovskite functional layer comprises perovskite crystal grains having an $[A^{+1}B^{+2}X^{-1}{}_3]$ structure, where the A-site ion is selected from the group consisting of $FA^+$, $MA^+$, $Cs^+$, $Rb^+$, $EA^+$, $GA^+$, and a combination thereof, the B-site ion is selected from the group consisting of $Pb^{2+}$, $Sn^{2+}$, $Ge^{2+}$ or compounds thereof, and X-site is selected from the group consisting of $I^-$, $Br^-$, $Cl^-$, and a combination thereof; and
(2) the second photovoltaic functional layer comprises a material selected from the group consisting of a perovskite photovoltaic material, a Si photovoltaic material, a CIGS photovoltaic material, a CdTe photovoltaic material, an organic photovoltaic material, and a combination thereof.

11. The solar cell device of claim 8, wherein the substrate comprises a substrate material selected from the group consisting of glass, PMMA, PC, PS, PET, PEN, PDMS, SEBS, PETG, ABS, PP, PA, AS and a combination thereof.

12. The solar cell device of claim 8, wherein the metal electrode is fabricated by depositing a metal material having a resistivity less than about $5\times10^{-7}$ Ω·m (at 25° C.).

13. The solar cell device of claim 6, wherein the at least one lead trapping layer covers the surface of the device, or is located in the interior of the device.

14. The solar cell device of claim 8, wherein the at least one lead trapping layer contacts any of the following positions:

(1) only the upper surface of the metal electrode;
(2) the top of the device and extends downwards to wrap the side of the device;
(3) the periphery of the device; or
(4) the top and bottom of the device.

15. The solar cell device of claim 14, wherein the at least one lead trapping layer comprises a conductive encapsulation resin and wherein the lead trapping layer contacts any of the following additional positions:

(5) between the perovskite functional layer and the first hole-transport layer;
(6) on the upper and lower surfaces of the perovskite functional layer;
(7) around the perovskite functional layer; or
(8) between the first electron-transport layer and the metal electrode.

16. The solar cell device of claim 8, wherein the material of the perovskite functional layer is selected from the group consisting of $CsPb_{0.5}Sn_{0.5}I_3$, $FAPbI_3$, $MA_{0.25}FA_{0.75}PbI_{2.2}Br_{0.6}Cl_{0.2}$, $Cs_{0.02}FA_{0.96}MA_{0.02}PbI_{0.99}Cl_{0.01}$, $MAPb_{0.92}Sn_{0.08}I_3$, $(FA_{0.95}MA_{0.05})_{0.95}Cs_{0.05}Pb(I_{0.96}Br_{0.04})_3$, $Rb_{0.1}FA_{0.8}GA_{0.1}Pb_{0.6}Ge_{0.4}I_3$, and $(FA_{0.92}MA_{0.08})_{0.9}Cs_{0.1}Pb(I_{0.92}Br_{0.08})_3$.

17. A method of preparing a lead trapping layer, comprising the steps of:

mixing the acidic cation-exchange resin and the encapsulation resin under vigorous mechanical stirring to form a colloidal mixed resin; and applying the colloidal mixed resin to a position selected from the group consisting of:

(1) only on the upper surface of the metal electrode;
(2) from the top of the device extended downwards to wrap the side of the device;
(3) on the periphery of the device;
(4) on the top and bottom of the device;
(5) between the perovskite functional layer and the first hole-transport layer;
(6) on the upper and lower surfaces of the perovskite functional layer;
(7) around the perovskite functional layer; and
(8) between the first electron-transport layer and the metal electrode, wherein the lead trapping layer comprises:

(a) an acidic cation-exchange resin comprising a formula selected from the group consisting of:

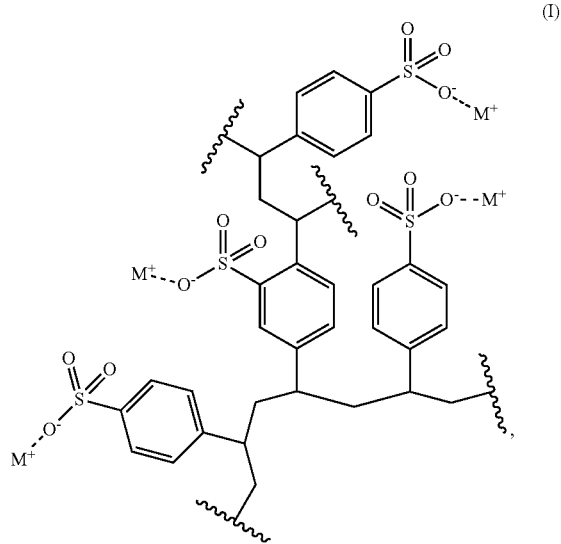

(I)

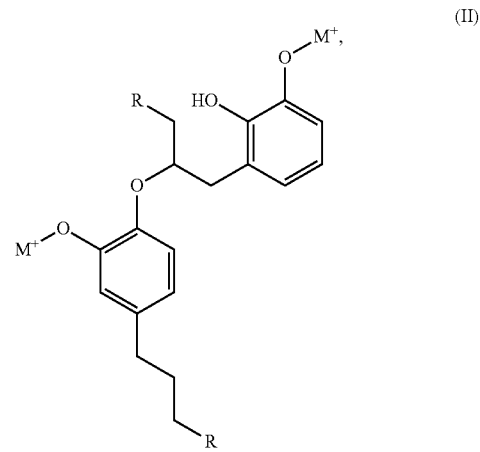

(II)

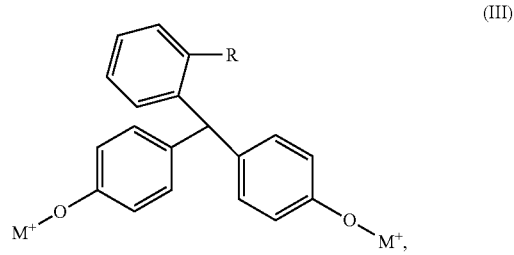

(III)

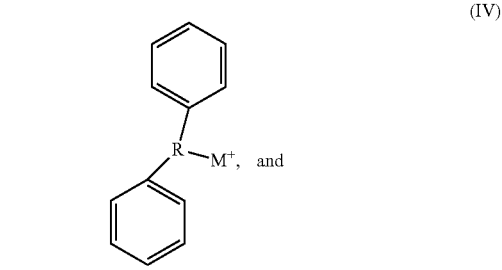

(IV)

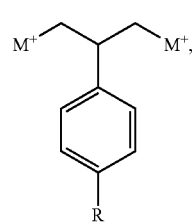

(V)

wherein
each M⁺ is independently selected from the group consisting of $Sr^{2+}$, $Ca^{2+}$, $Ni^{2+}$, $Cu^{2+}$, $Co^{2+}$, $Zn^{2+}$, $Mg^{2+}$, $Ba^{2+}$, $K^+$, $NH_4^+$, $Na^+$, $H^+$, and $Li^+$; and
each R is independently selected from the group consisting of $SO_3H$, $CH_2SO_3H$, $PO_3H_2$, and $COOH$; and
(b) an encapsulation resin selected from the group consisting of an epoxy resin, a silicone resin, an arcrylate resin, and a combination thereof.

18. The method of claim 17, wherein the acidic cation-exchange resin is ground into powder prior to the mixing step, and the method further comprises the step of curing the mixed resin via UV light.

19. The method of claim 18, wherein the powder of the acidic cation-exchange resin is dried at at from about 45° C. to about 120° C. for about 1 h to about 16 h prior to the mixing step.

20. The method of claim 17, wherein the encapsulation resin and the acidic cation-exchange resin are mixted in a weight ratio ranging from about 20:1 to about 200:1.

* * * * *